United States Patent
Kishimoto et al.

(10) Patent No.: US 6,555,998 B1
(45) Date of Patent: Apr. 29, 2003

(54) APPARATUS AND METHOD FOR SIMULATION OF ELECTROMAGNETIC FIELD AND STORAGE MEDIUM STORING PROGRAMS THERFOR

(75) Inventors: Takeshi Kishimoto, Kawasaki (JP); Shinichi Ohtsu, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/447,051

(22) Filed: Nov. 23, 1999

(30) Foreign Application Priority Data

Nov. 24, 1998 (JP) .......................... 10-331830

(51) Int. Cl.[7] .................... G01R 19/00; G01R 33/02; G01R 33/00; G06F 7/60; G06F 17/50
(52) U.S. Cl. .................. 324/76.11; 324/244; 324/260; 703/2; 716/4
(58) Field of Search ................. 324/260, 244, 324/76.11; 395/500.26, 500.25; 703/2–5; 716/3–4

(56) References Cited

U.S. PATENT DOCUMENTS

| | | | | |
|---|---|---|---|---|
| 5,355,887 A | * | 10/1994 | Iizuka et al. | 128/660.04 |
| 5,537,329 A | * | 7/1996 | Feldmann et al. | 716/4 |
| 5,745,370 A | * | 4/1998 | Ohtsu et al. | 716/3 |
| 5,757,015 A | * | 5/1998 | Takemoto et al. | 250/491.1 |
| 5,812,434 A | * | 9/1998 | Nagase et al. | 703/2 |
| 6,098,039 A | * | 8/2000 | Nishida | 704/229 |
| 6,129,459 A | * | 10/2000 | Kishimoto et al. | 324/260 |

FOREIGN PATENT DOCUMENTS

| | | |
|---|---|---|
| EP | 0778533 A2 | 6/1997 |
| EP | 0778533 A3 | 4/1998 |
| JP | 09196986 | 7/1997 |
| JP | 10-94157 | 4/1998 |
| JP | 11-296500 | 10/1999 |

OTHER PUBLICATIONS

U.S. patent application Ser. No. 09/282,425, Nagase et al., filed Mar. 3, 1999.
U.S. patent application Ser. No. 08/749,649, Otsu, et al., filed Nov. 15, 1996.

* cited by examiner

Primary Examiner—Michael Sherry
Assistant Examiner—Jermele Hollington
(74) Attorney, Agent, or Firm—Staas & Halsey LLP

(57) ABSTRACT

An apparatus provided with a setting unit for selecting a frequency spectrum to be processed from among a plurality of frequency spectrums contained in an angle-modulated wave source and setting one or a plurality of sample frequencies from among the spectrums, a calculating unit for calculating an intensity of an electromagnetic field radiated from an electronic apparatus by analysis in the frequency domain under the moment method or the like using the sample frequency set by the setting unit as the analyzing frequency, and a computing unit for calculating a physical amount to be calculated other than the physical amount calculated by the calculation unit in the frequency domain of the frequency spectrum to be processed, by using a proportional operation, from the physical amount calculated by the calculating unit and the wave source value of the frequency spectrum to be processed.

20 Claims, 21 Drawing Sheets

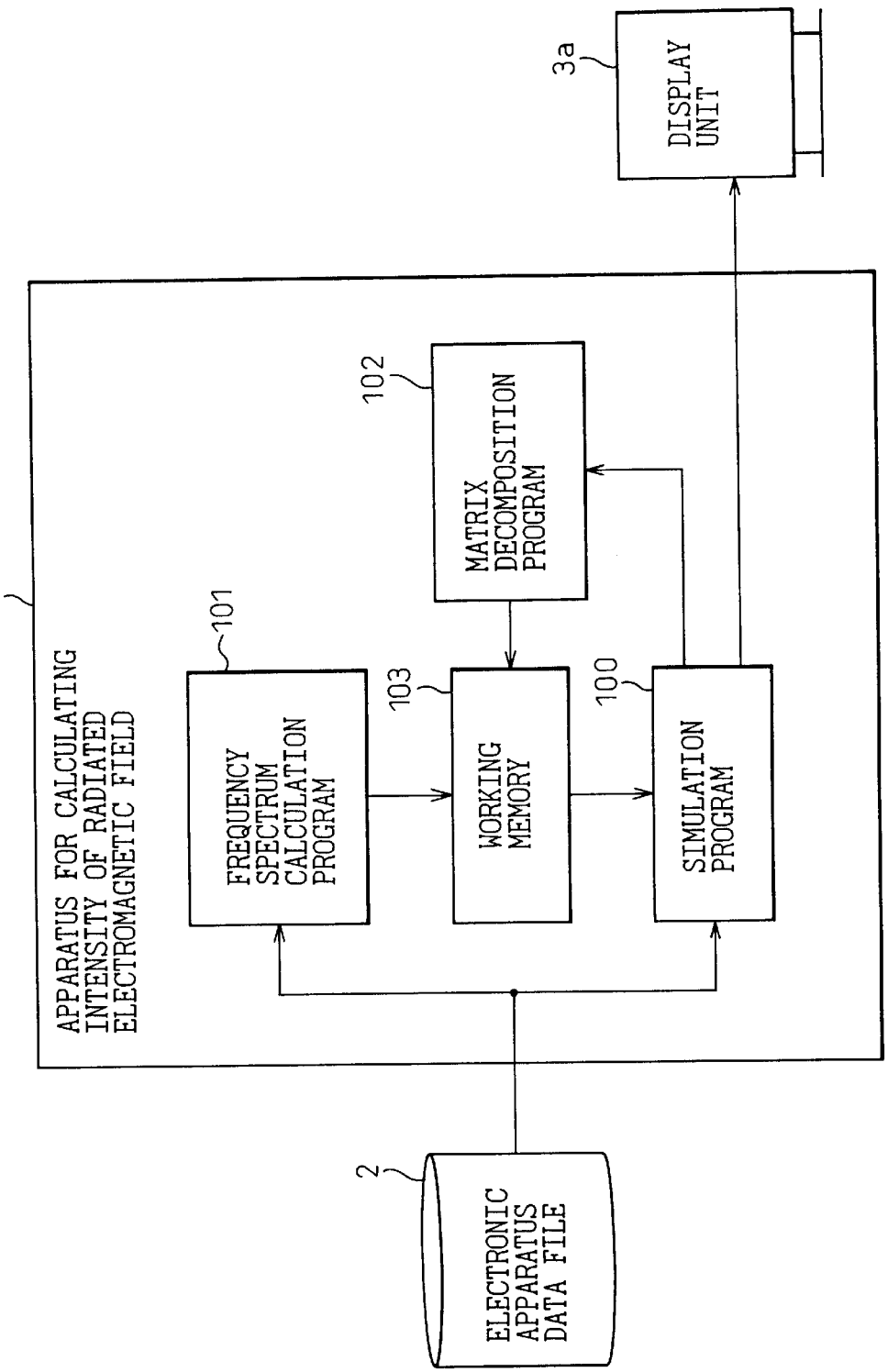

Fig.3

$$\begin{bmatrix} Z_{11} & Z_{12} & Z_{13} & \cdots & Z_{1m} & \cdots & Z_{1N} \\ Z_{21} & Z_{22} & Z_{23} & \cdots & Z_{2m} & \cdots & Z_{2N} \\ Z_{31} & Z_{32} & Z_{33} & \cdots & Z_{3m} & \cdots & Z_{3N} \\ \vdots & \vdots & \vdots & \ddots & \vdots & & \vdots \\ Z_{m1} & Z_{m2} & Z_{m3} & \cdots & Z_{mm} & \cdots & Z_{mN} \\ \vdots & \vdots & \vdots & & \vdots & \ddots & \vdots \\ Z_{N1} & Z_{N2} & Z_{N3} & \cdots & Z_{Nm} & \cdots & Z_{NN} \end{bmatrix} \begin{bmatrix} I_1 \\ I_2 \\ I_3 \\ \vdots \\ I_m \\ \vdots \\ I_N \end{bmatrix} = \begin{bmatrix} V_1 \\ V_2 \\ V_3 \\ \vdots \\ V_m \\ \vdots \\ V_N \end{bmatrix}$$

MUTUAL IMPEDANCE     CURRENT     WAVE SOURCE

N: NUMBER OF ELEMENTS $$\begin{bmatrix} Z^o{}_{c,c} & Z^o{}_{c,d} & B^o{}_{c,d} \\ Z^o{}_{d,c} & Z^o{}_{d,d}+Z^d{}_{d,d} & B^o{}_{d,d}+B^d{}_{d,d} \\ B^o{}_{d,c} & B^o{}_{d,d}+B^d{}_{d,d} & -Y^o{}_{d,d}-Y^d{}_{d,d} \end{bmatrix} \begin{bmatrix} I_{c,n} \\ I_{d,n} \\ M_n \end{bmatrix} = \begin{bmatrix} V_i \\ 0 \\ 0 \end{bmatrix}$$

Fig.6A $$\left\{ Z = j\omega \int_s \left[ \frac{\mu}{4\pi} J_1 J_2 \cos\phi \frac{e^{-jkr}}{r} \right. \right.$$
$$\left. \left. + \frac{1}{4\pi\varepsilon} \rho_1 \rho_2 \frac{e^{-jkr}}{r} \right] ds \right.$$

Fig.6B $$\left\{ Z_{13} = \frac{j\omega\mu}{4\pi \sin kd_1 \sin kd_3} \int_{t_0}^{t_1} \int_{z_0}^{z_1} [\sin k(z-z_0) \sin k(t-t_0) \cos\phi_1 \right.$$
$$\left. -\cos k(z-z_0) \cos k(t-t_0)] \frac{e^{-jkr}}{r} dzdt \right.$$

$$\left. Z_{14} = \frac{j\omega\mu}{4\pi \sin kd_1 \sin kd_4} \int_{t_1}^{t_2} \int_{z_0}^{z_1} [\sin k(z-z_0) \sin k(-t+t_2) \cos\phi_2 \right.$$
$$\left. +\cos k(z-z_0) \cos k(-t+t_2)] \frac{e^{-jkr}}{r} dzdt \right.$$

Fig.7

$$Z = LU = \begin{bmatrix} 1 & 0 & \cdot & \cdot & \cdot & \cdot & 0 \\ \ell_{21} & & & & & & \cdot \\ \cdot & & & 0 & & & \cdot \\ \cdot & & & & & & \cdot \\ \cdot & & \ell & & & & \cdot \\ \cdot & & & & & & 0 \\ \ell_{n1} & \cdot & \cdot & \cdot & \ell_{nn-1} & 1 \end{bmatrix} \begin{bmatrix} u_{11} & u_{12} & \cdot & \cdot & \cdot & u_{1n} \\ 0 & & & & & \cdot \\ \cdot & & & u & & \cdot \\ \cdot & & & & & \cdot \\ \cdot & & 0 & & & u_{n-1} \\ 0 & \cdot & \cdot & \cdot & 0 & u_{nn} \end{bmatrix}$$

Fig.8

$$Z = LDU = LD^tL =$$

$$\begin{bmatrix} 1 & 0 & \cdots & \cdots & 0 \\ \ell_{21} & \ddots & \ddots & & \vdots \\ \vdots & \ddots & \ddots & \ddots & \vdots \\ \vdots & & \ell & \ddots & 0 \\ \ell_{n1} & \cdots & \cdots & \ell_{nn-1} & 1 \end{bmatrix} \begin{bmatrix} d_{11} & 0 & \cdots & \cdots & 0 \\ 0 & \ddots & \ddots & & \vdots \\ \vdots & \ddots & \ddots & \ddots & \vdots \\ \vdots & & \ddots & \ddots & 0 \\ 0 & \cdots & \cdots & 0 & d_{nn} \end{bmatrix} \begin{bmatrix} 1 & \ell_{21} & \cdots & \cdots & \ell_{n1} \\ 0 & \ddots & \ddots & & \vdots \\ \vdots & \ddots & \ell & \ddots & \vdots \\ \vdots & & \ddots & \ddots & \ell_{nn-1} \\ 0 & \cdots & \cdots & 0 & 1 \end{bmatrix}$$

| | |
|---|---|
| END POINTS OF MONOPOLE | $z_0, z_1$ |
| DIRECTION OF CURRENT | $z_0 \rightarrow z_1$ |
| POSITION OF WAVE SOURCE | $z'$ |
| LENGTH OF MONOPOLE | $d (= z_1 - z_0)$ |
| DISTANCE BETWEEN WAVE SOURCE AND OBSERVATION POINT | $r = \sqrt{\rho^2 + (z-z')^2}$ <br> $r_0 = \sqrt{\rho^2 + (z-z_0)^2}$ <br> $r_1 = \sqrt{\rho^2 + (z-z_1)^2}$ |
| DISTRIBUTION OF CURRENT | $J^+ = \dfrac{\sin k(d - z' + z_0)}{\sin kd}$ <br> $J^- = \dfrac{\sin k(d + z' - z_1)}{\sin kd}$ |

Fig.13

$$E_z^+(z,\rho) = -\frac{j\omega\mu}{4\pi k \sin kd} \left\{ \left[\frac{\exp(-jkr_1)}{r_1} - \cos kd \frac{\exp(-jkr_0)}{r_0}\right] \right.$$

$$-j(z-z_0) \sin kd \frac{\exp(-jkr_0)}{r_0^2} - \frac{z-z_0}{k} \sin kd \frac{\exp(-jkr_0)}{r_0^3} \right\}$$

$$E_\rho^+(z,\rho) = -\frac{j\omega\mu}{4\pi k \rho \sin kd} \left\{ \left[-(z-z_1)\frac{\exp(-jkr_1)}{r_1} + (z-z_0)\cos kd \frac{\exp(-jkr_0)}{r_0}\right] \right.$$

$$+j(z-z_0)^2 \sin kd \frac{\exp(-jkr_0)}{r_0^2} - \frac{\rho^2}{k} \sin kd \frac{\exp(-jkr_0)}{r_0^3} \right\}$$

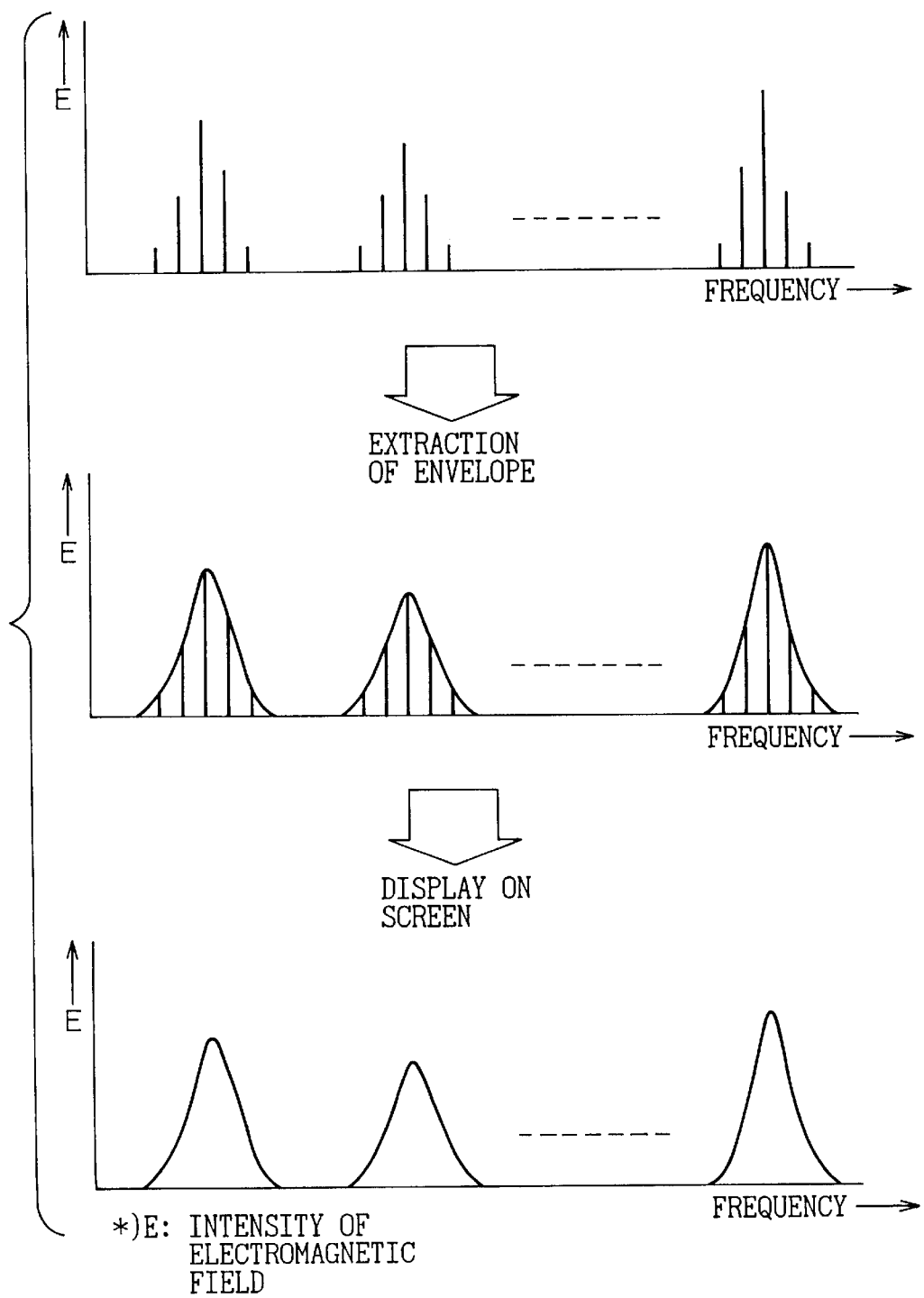

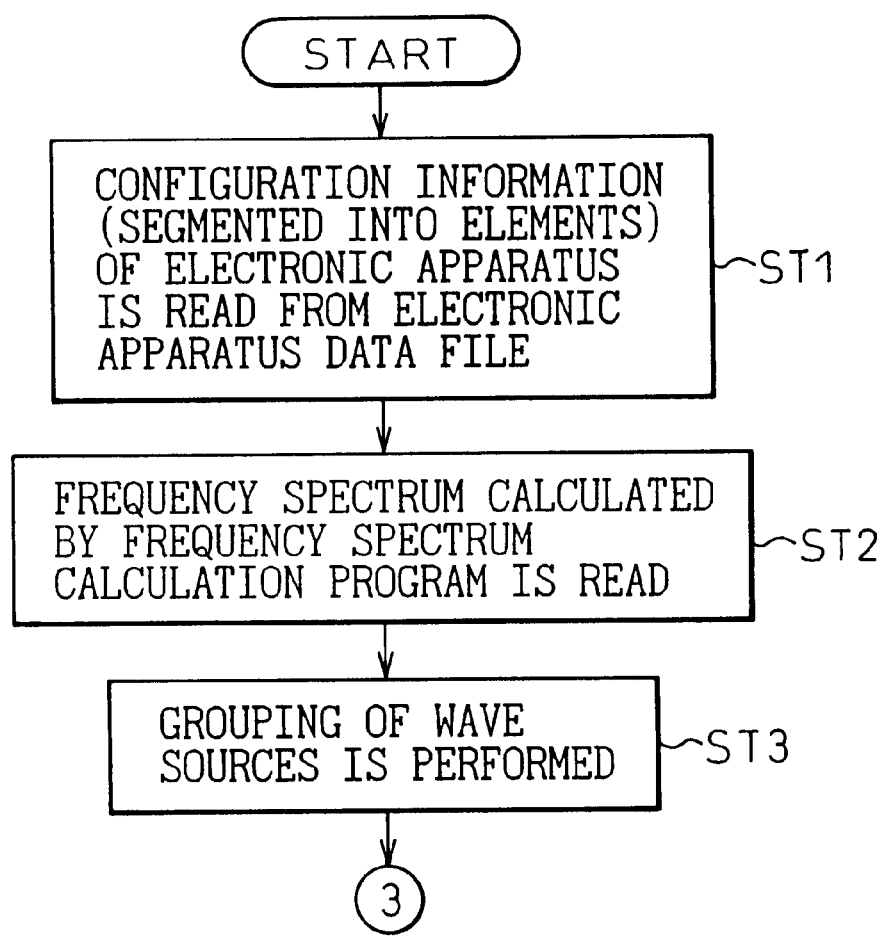

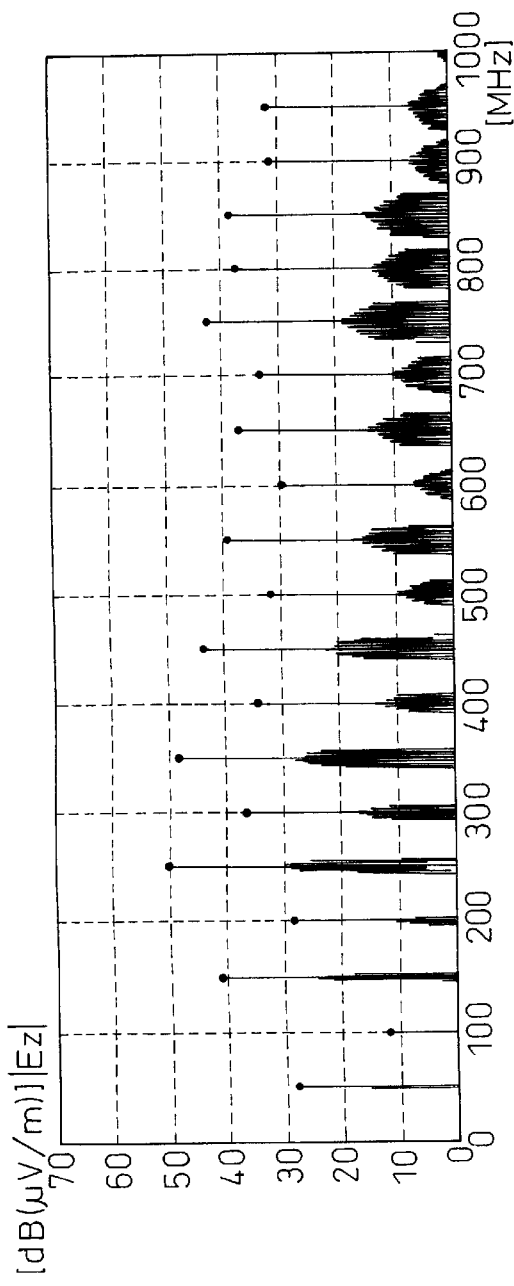
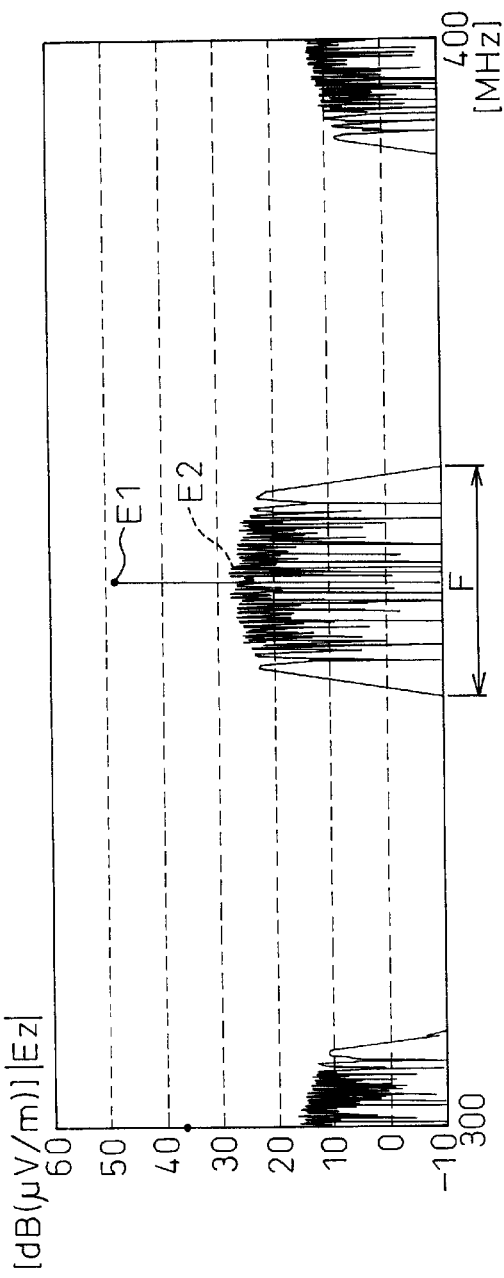
Fig.18B
Fig.18C

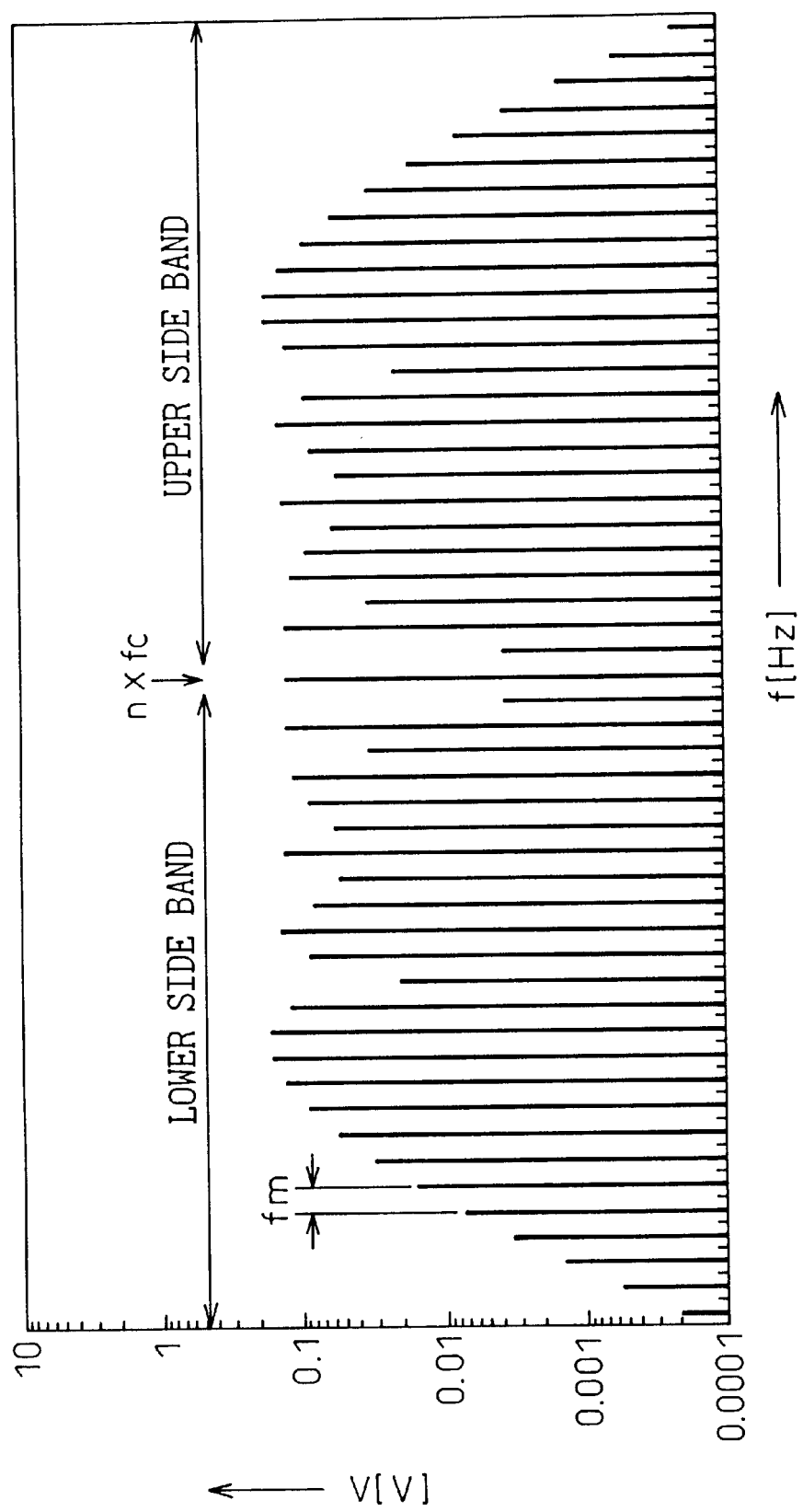

APPARATUS AND METHOD FOR SIMULATION OF ELECTROMAGNETIC FIELD AND STORAGE MEDIUM STORING PROGRAMS THERFOR

BACKGROUND OF THE INVENTION

1. Field of the Invention

The present invention relates to an apparatus and a method for simulation of an electromagnetic field which calculates an electric current flowing through each element of an electronic apparatus or an intensity of an electromagnetic field radiated from the electronic apparatus according to analysis in a frequency domain and to a storage medium storing programs used for realization of the simulation apparatus, more particularly relates to an apparatus and a method for simulation enabling execution of simulation processing at a high speed when the electronic apparatus to be analyzed has an angle-modulated wave source and to a storage medium storing programs used for realization of the simulation apparatus.

One of the new regulations being imposed by society on electronic apparatuses is that they must not radiate undesired radio waves and noise of a predetermined level or more. Tough regulations on this have been established in the major countries of the world.

In order to satisfy such radio wave regulations, various countermeasures such as shielding and filtering are used, but to employ these countermeasures, development of the simulation technology enabling quantitative calculation of how much they can attenuate the radio waves is necessary.

In view of this, the present inventors disclosed an invention of simulation technology for calculating the intensity of the electromagnetic field radiated from an electronic apparatus by using the moment method. In order to make this simulation technology practical, it is necessary to develop technology which makes it possible to execute the simulation processing at a high speed.

2. Description of the Related Art

The intensity of the electromagnetic field radiated from the object can be simulated by finding an electric current and a magnetic current flowing through each portion of the object and substituting these in a known theoretical equation of electromagnetic wave radiation. These electric current and magnetic current flowing through each portion of the object can be theoretically acquired by solving Maxwell's electromagnetic equations under given boundary conditions.

As one solving this, there is the moment method. The moment method is one of the methods of solution of integration equations derived from Maxwell's electromagnetic equations and is a technique for calculating the electric current and the magnetic current by segmenting an object into small elements. It can handle any three-dimensionally shaped object. As a reference document for this moment method, there is H. N. Wang, J. H. Richmond, and M. C. Gilreath, "Sinusoidal reaction formulation for radiation and scattering from conducting surface", *IEEE TRANSACTIONS ANTENNAS PROPAGATION*, vol. AP-23, 1975".

In this moment method, when the configuration of the electronic apparatus to be simulated is segmented into meshes and the frequency to be processed is selected, a mutual impedance, a mutual admittance, and a mutual reaction among meshed elements are found for that frequency by a predetermined calculation, the found mutual impedance etc. and a wave source specified by the configuration information are substituted in simultaneous equations under the moment method, and the equations are solved to find the electric current and the magnetic current flowing through the element.

Namely, when handling a metal object, a method is adopted of segmenting the metal part to be analyzed into meshes, finding a mutual impedance $Z_{ij}$ (value at the frequency to be processed) among mesh-like metal elements, and solving the following simultaneous equations under the moment method standing among this mutual impedance $Z_{ij}$, a wave source $V_i$ of the frequency component, and an electric current $I_i$ flowing through the mesh-like metal elements:

$$[Z_{ij}][I_i]=[V_i]$$

where, [ ] indicates a matrix to find the electric current $_i$ and calculating the intensity of the electromagnetic field from a resultant current $I_i$.

Note that the mutual impedance represents the relationship between an electric field induced by the electric current of one element and the electric current of another element. The mutual admittance becomes necessary when considering the existence of a dielectric and represents the relationship between a magnetic field induced by the magnetic current of one element and the magnetic current of another element. The mutual reaction becomes necessary when considering the existence of a dielectric and represents the relationship between the electric field (magnetic field) induced by the electric current (magnetic current) of one element and the magnetic current (electric current) of another element. Here, the electric current flows through the metal, and both of electric current and magnetic current flow on the surface of the dielectric.

When the intensity of the electromagnetic field radiated from the electronic apparatus is simulated by using this moment method, it is necessary to specify the frequency of the wave source provided by the electronic apparatus and solve the simultaneous equations under the moment method at every specified frequency.

Due to this, up until the present time, when the electronic apparatus is provided with a clock source as the wave source, by applying Fourier transform to the clock signal oscillated by the clock source, the frequency to be analyzed is specified. Further, a method of solving the simultaneous equations under the moment method at every specified frequency to simulate the intensity of the electromagnetic field radiated from the electronic apparatus has been employed.

As one simulating the intensity of the electromagnetic field radiated from the electronic apparatus other than the moment method, there is another simulation technique of analysis in the frequency domain, such as finite element method. In the case where such a simulation technique is used, up to the present time, when the electronic apparatus has a clock source as the wave source, by applying the Fourier transform to the clock signal oscillated by the clock source, the frequency to be analyzed is specified. Further, the method of executing the analysis in the frequency domain at every specified frequency to simulate the intensity of the electromagnetic field radiated from the electronic apparatus has been employed.

Recently, the technique referred to as a spread spectrum clocking (SSC) as shown in FIG. 18A which makes the frequency of the clock source provided by the electronic apparatus swing back and forth by the modulation frequency to attenuate the intensity of the electromagnetic field radiated from the electronic apparatus (technique identical to the technique in which carrier wave fc is angle-modulated with a modulation frequency fm) is now being used.

FIG. 18B is a graph of actually measured data representing an electromagnetic field intensity attenuation effect due to SSC, and FIG. 18C is a graph extracting and enlarging part of the graph of FIG. 18B.

As clear from FIGS. 18B and 18C, by applying the angle modulation to the clock from the clock source, the frequency distribution spreads as shown by F in FIG. 18C, but the intensity of the electromagnetic field thereof becomes E2 and is greatly attenuated compared with the intensity of the electromagnetic field (E1) when the angle modulation is not applied. This will be explained in further detail below by paying attention to one spectrum.

When applying a Fourier transform to the clock signal from a clock source oscillating with a single frequency, as is well known, an oscillating frequency (fc) and higher harmonics (2fc, 3fc, 4fc, . . . ) of the oscillating frequency will appear. However, when applying the Fourier transform to the clock signal from the clock source operating by this spread spectrum clocking, as shown in FIG. 19, an extremely large number of frequencies (side bands) will appear in the vicinity of both the oscillating frequency (fc) and higher harmonics (2fc, 3fc, 4fc, . . . ) thereof in a manner of a shift by each modulation frequency (fm).

Incidentally, the number of these side bands is determined by:

Number of side bands=2×modulation index+1

Modulation index=(deviation of frequency to be swung by)/fm

Due to this, there was a problem in that, when the intensity of the electromagnetic field radiated from the electronic apparatus provided with the clock source operated by the spread spectrum clocking is simulated, if according to the related art an extremely large number of frequencies must be analyzed, an enormous time is taken for simulating the intensity of the electromagnetic field radiated from the electronic apparatus, and therefore the simulation cannot be carried out in actuality.

SUMMARY OF THE INVENTION

The present invention was made in consideration with such a circumstance and has an object thereof to provide a novel simulation apparatus and method enabling execution of the simulation processing at a high speed when the electronic apparatus to be analyzed has the angle-modulated wave source, according to the analysis in the frequency domain, while employing a calculation of the electric current flowing through each element of the electronic apparatus and the intensity of the electromagnetic field radiated from the electronic apparatus and to provide a novel storage medium storing programs used for the realization of the simulation apparatus.

To attain the above object, the apparatus of the present invention comprises a setting unit for selecting a frequency spectrum to be processed from among a plurality of frequency spectrums included in an angle-modulated wave source and setting one or a plurality of sample frequencies from among the spectrums, a calculating unit for calculating an intensity of the electromagnetic field radiated from an electronic apparatus by executing analysis in a frequency domain under a moment method or the like with the sample frequency set by the setting unit as the analyzing frequency, and a computing unit for computing a physical amount to be calculated other than the physical amount calculated by the calculating unit in the frequency domain of the frequency spectrum to be processed, by using a proportional operation, from the physical amount calculated by the calculating unit and the wave source value of the frequency spectrum to be processed. By this, a simulation apparatus enabling high speed simulation of the intensity of the electromagnetic field radiated from the angle-modulated electronic apparatus is provided.

BRIEF DESCRIPTION OF THE DRAWINGS

The above object and features of the present invention will be more apparent from the following description of the preferred embodiments given with reference to the accompanying drawings, wherein:

FIG. 2 is an embodiment of the present invention;

FIG. 3 is a view explaining simultaneous equations under the moment method;

FIGS. 6A and 6B are views explaining the method of calculation of the mutual impedance;

FIG. 7 is a view explaining LU decomposition;

FIG. 8 is a view explaining LDU decomposition;

FIG. 13 is a view explaining the equation for calculation of the electric field;

FIG. 16 is a view explaining the processing for execution of the simulation program;

FIGS. 17A and 17B show another embodiment of the flow of processing of the simulation program;

FIGS. 18A, 18B, and 18C are views explaining the spread spectrum clocking; and

FIG. 19 is a view explaining spread spectrum clocking paying attention to one spectrum.

DESCRIPTION OF THE PREFERRED EMBODIMENTS

The present invention will be described with reference to the related figures.

Figure 1:
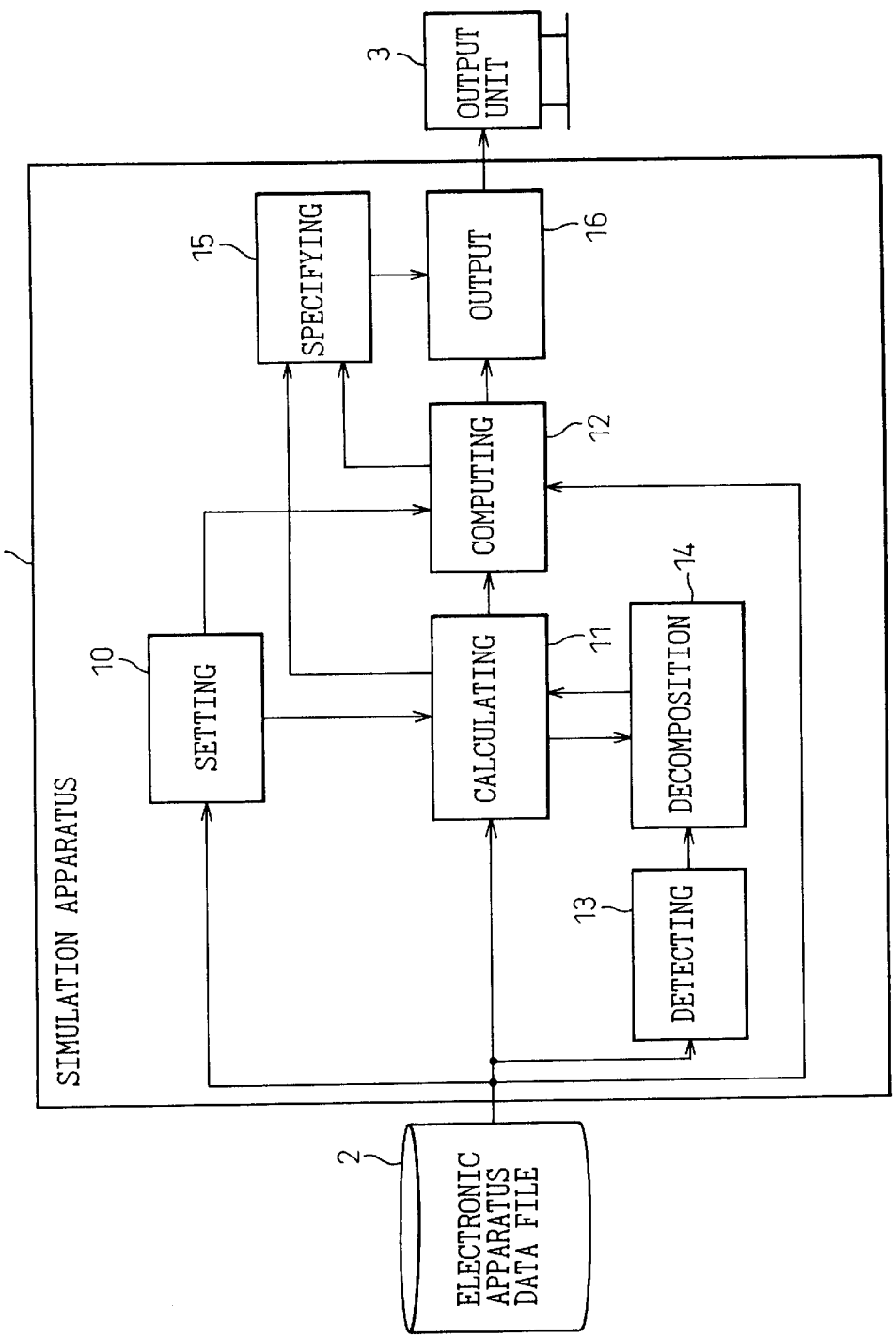
FIG. 1 is a view of the principle configuration of the present invention.

FIG. 1 illustrates the principle configuration of the present invention (indicated by a hardware image).

In the figure, 1 is a simulation apparatus according to the present invention and simulates, on an electronic apparatus, as the object of analysis, having an angle-modulated wave source, the electric current flowing through each element of the electronic apparatus or the intensity of the electromagnetic field radiated from the electronic apparatus according to analysis in the frequency domain. Reference numeral 2 is an electronic apparatus data file provided by the simulation apparatus 1 and stores the configuration information of the electronic apparatus to be analyzed, while 3 is an output unit provided by the simulation apparatus 1 and outputs the results of the simulation by the simulation apparatus 1.

The simulation apparatus 1 of the present invention is provided with a setting means 10, a calculating means 11, a computing means 12, a detecting means 13, a decomposition means 14, a specifying means 15, and an output means 16.

This setting means 10 selects the frequency spectrum to be processed from among the frequency spectrums of the angle-modulated wave source provided in the electronic apparatus to be analyzed and sets for example the center frequency from among selected frequencies as the sample frequency and thereby one sample frequency is set. For example, by setting sample frequencies in a manner so that for example the sample frequency of the upper frequency domain and the sample frequency of the lower frequency domain become symmetrical about the center frequency, a plurality of sample frequencies are set.

The calculating means 11 calculates the physical amount (electric current and intensity of the electromagnetic field) to be calculated at the analyzing frequency by executing the analysis in the frequency domain under the moment method or the like with the sample frequency set by the setting means 10 as the analyzing frequency.

The computing means 12 calculates the physical amount to be calculated other than the physical amount calculated by the calculating means 11 in a frequency domain of the frequency spectrum to be processed from both the physical amount calculated by the calculating means 11 and the wave source value of the frequency spectrum to be processed selected by the setting means 10.

The detecting means 13 detects whether or not the matrixes used in the analysis in the frequency domain will be reused by the calculating means 11 when the electronic apparatus to be analyzed has a plurality of wave sources. The decomposition means 14 applies LU decomposition or LDU decomposition to each matrix which can be reused and is detected by the detecting means 13.

The specifying means 15 specifies an envelope of the physical amount calculated by the calculating means 11 and the computing means 12. The output means 16 outputs the envelope specified by the specifying means 15 to the output unit 3.

Here, a function provided by the simulation apparatus 1 of the present invention is concretely realized by a program. The program is stored in a floppy disk etc. or stored in the disk of a server etc. Programs are installed from the floppy disk etc. into the simulation apparatus 1 and operate on the memory, thereby to realize the present invention.

In the simulation apparatus 1 of the present invention configured in this way, when the setting means 10 selects the frequency spectrum to be processed and sets one or a plurality of sample frequencies from among them, the calculating means 11 executes the analysis in the frequency domain under the moment method or the like with the set sample frequency as the analyzing frequency so as to calculate the physical amount (the electric current and the intensity of the electromagnetic field) to be calculated at the analyzing frequency.

Responding to the calculation processing of this calculating means 11, the computing means 12 finds a ratio between the wave source value of the sample frequency and the wave source value at a frequency other than the sample frequency contained in the frequency spectrum to be processed when the setting means 10 sets one sample frequency and then computes the ratio and the physical amount calculated by the calculating means 11 so as to calculate a physical amount to be calculated other than the physical amount calculated by the calculating means 11 in the frequency domain of the frequency spectrum to be processed.

Further, responding to the calculation of the calculating means 11, when the setting means 10 sets a plurality of sample frequencies, the computing means 12 finds the ratio between the wave source value of a frequency sandwiched between adjoining sample frequencies and a corresponding linear interpolation value derived by applying a linear interpolation on the wave source values at the sample frequencies and then processes that ratio and the corresponding linear interpolation value derived by applying a linear interpolation on the physical amounts calculated by the calculating means 11 so as to calculate the physical amount to be calculated other than the physical amount calculated by the calculating means 11 in the frequency domain of the frequency spectrum to be processed.

Then, the specifying means 15 specifies the envelope of the discrete physical amount calculated by the calculating means 11 and the computing means 12. In response to this, the output means 16 outputs the envelope specified by the specifying means 15 to the output unit 3 as the physical amount given by the wave source so as to output the simulation results in the form of the physical amount which form is identical to the one acquired at the actual measurement unit.

When employing the above concept and also the electronic apparatus to be analyzed has a plurality of wave sources, these wave sources are subject to different angle modulation modes (including also the case where there is no angle-modulated wave source). Further, when the frequency domains of the wave sources overlap, simulation processing is performed assuming that each wave source exists separately and then the simulation results for respective wave sources are superimposed.

Therefore, the detecting means 13 detects, due to coincidence of overlapping frequencies, whether or not matrixes used in the analysis in the frequency domain will be reused. Upon receipt of the result, the decomposition means 14 applies LU decomposition or LDU decomposition to the matrix which can be reused when a matrix which can be reused is detected by the detecting means 13. Then, after the decomposition, the calculating means 11 executes the analysis in the frequency domain by using the LD decomposed or LDU decomposed matrix from the decomposition means 14. Thus, the physical amount to be calculated is calculated at a high speed.

In this way, in the simulation apparatus 1 of the present invention, note was taken of the fact that, when adopting the concept of simulating the electric current flowing through each element of the electronic apparatus or the intensity of the electromagnetic field radiated from the electronic apparatus according to the moment method or other analysis in the frequency domain on the electronic apparatus having an angle-modulated wave source, a proportional relationship stands among physical amounts to be calculated due to the fact that, in a frequency domain narrow to a certain extent, there is almost no change of the matrix (mutual impedance etc. in the case of the moment method) used in the analysis in the frequency domain. Whereby an accurate simulation processing is carried out and simulation results obtained at only the sample frequency. For the frequencies other than this sample frequency, the simulation results are used to obtain simulation results according to a proportional operation. By this, it becomes possible to execute the simulation processing at an extremely high speed.

By this, it becomes possible to simulate the electric current flowing through an electronic apparatus having an angle-modulated wave source or the intensity of the electromagnetic field radiated from an electronic apparatus having an angle-modulated wave source within a time practical.

Further, in the simulation apparatus 1 of the present invention, the discrete electric current and intensity of the electromagnetic field on the frequency domain acquired by this simulation processing are not output as they are, but are output in the form of an envelope which form is identical to that acquired in the actual measurement unit (for example, spectrum analyzer). By this, it becomes possible to show the simulation results to the user without causing discomfort.

The present invention will be explained in detail below according to a preferred embodiment.

FIG. 2 illustrates an embodiment of an apparatus 1a for calculating the intensity of the radiated electromagnetic field (indicated by a software image) according to the present invention.

The apparatus 1a for calculating the intensity of a radiated electromagnetic field according to this embodiment of the present invention simulates the intensity of the electromagnetic field radiated from an electronic apparatus having an angle-modulated clock source and is provided with an electronic apparatus data file 2 for storing the configuration information of the electronic apparatus to be simulated, a display unit 3a for displaying the simulation results, a simulation program 100, a frequency spectrum calculation program 101, a matrix decomposition program 102, and a working memory 103 prepared for the work of these programs.

This simulation program 100 is installed through a floppy disk, transmission line, etc. Then, it calculates the intensity of the electromagnetic field radiated from the electronic apparatus to be simulated under the moment method. The frequency spectrum calculation program 101 is installed through a floppy disk, transmission line, etc. Then, it calculates the frequency spectrum of the clock source provided in the electronic apparatus to be simulated. The matrix decomposition program 102 is installed through a floppy disk, transmission line, etc. and applies LU decomposition (or LDU decomposition) to the mutual impedance etc. calculated by the simulation program 100 under the moment method.

Here, for convenience of explanation, the apparatus 1a for calculating the intensity of a radiated electromagnetic field according to the present invention was configured to run three types of programs, that is, the simulation program 100, the frequency spectrum calculation program 101, and the matrix decomposition program 102, but it is also possible to prepare the functions of these programs as one program. Further, it is also possible to configure the invention so as not to run the frequency spectrum calculation program 101 by preparing a frequency spectrum to be calculated by the frequency spectrum calculation program 101 as a table in advance.

The simulation program 100 segments the configuration of the electronic apparatus to be simulated into meshes and sets the frequency to be analyzed. Then, the program 100 finds the mutual impedance, mutual admittance, and mutual reaction among meshed elements for the frequency to be analyzed by the predetermined calculation processing. By substituting the found mutual impedance etc. and the wave source designated by the configuration information into the simultaneous equations under the moment method and solving the equations, the electric current and the magnetic current flowing through each element are found. Then, processing is carried out for calculating the intensity of the electromagnetic field radiated from the electronic apparatus to be simulated from the found electric current and the magnetic current.

Figures 4, 5:
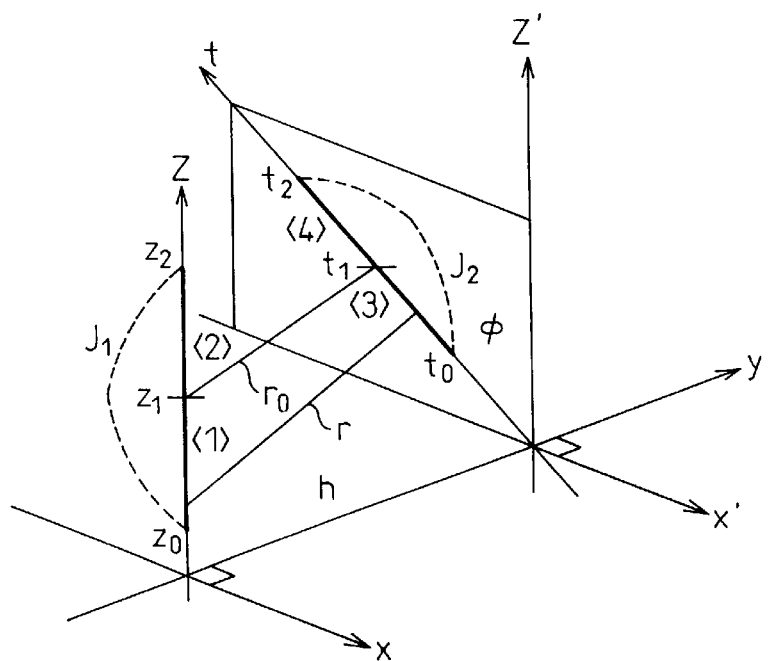
FIG. 4 is a view explaining simultaneous equations under the moment method.
FIG. 5 is a view explaining the method of calculation of the mutual impedance.

When handling a metal object, the metal part is segmented into meshes to be analyzed, the mutual impedance $Z_{ij}$ (value at the frequency to be analyzed) among these meshed metal elements is found, and the simultaneous equations under the moment method, shown in FIG. 3, standing among this mutual impedance $Z_{ij}$, wave source $V_i$ having the frequency component thereof, and the electric current $I_i$ having the frequency component flowing through the meshed metal elements are solved to find the electric current $I_i$ flowing through the metal elements Here, the simultaneous equations under the moment method, shown in FIG. 4, will be solved when considering the existence of a dielectric. In the figure, $Y_{ij}$ represents the mutual admittance among elements, $B_{ij}$ represents the mutual reaction among elements, $I_{c,n}$ represents the electric current flowing through a metal, $I_{d,n}$ represents the electric current flowing on the surface of the dielectric, $M_n$ represents the magnetic current flowing on the surface of the dielectric, the superscript 0 represents the value in air, the superscript d represents the value in the dielectric, the suffix c represents a metal, and the suffix d represents a dielectric.

The mutual impedance calculated at this time is concretely executed by assuming monopoles as shown in FIG. 5 (<1> to <4> in the figure).

Namely, a general formula of the mutual impedance $Z_{ij}$ between the element i and the element j is represented by the equation illustrated in FIG. 6A. In the figure, ω represents an angular frequency, k represents a wave number, r represents a distance between monopoles, $J_1$ and $J_2$ are shapes of distribution of the electric current on the monopoles, and φ represents the angle between monopoles, while $\rho_1 = (-1/j\omega) \times [\partial J_1/\partial t]$, $\rho_2 = (-1/j\omega) \times [\partial J_2/\partial t]$.

As the electric current distributions $J_1$ and $J_2$ on the monopoles, when assuming that:

Electric current monopole <1>

$J_1 = \mathrm{sink}(z-z_0)/\mathrm{sink}d_1$

Electric current monopole <2>

$J_1 = \mathrm{sink}(z_2-z)/\mathrm{sink}d_2$

Electric current monopole <3>

$J_2 = \mathrm{sink}(t-t_0)/\mathrm{sink}d_3$

Electric current monopole <4>

$J_2 = \mathrm{sink}(t_2-t)/\mathrm{sink}d_4$ where, $d_1$: length of monopole <1>, $d_2$: length of monopole <2>,
$d_3$: length of monopole <3>, $d_4$: length of monopole <4>
the mutual impedance $Z_{13}$ between the monopole <1> and the monopole <3> and the mutual impedance $Z_{14}$ between the monopole <1> and the monopole <4> are represented as shown by the equations illustrated in FIG. 6B.

Also, the mutual impedance $Z_{23}$ between the monopole <2> and the monopole <3> and the mutual impedance $Z_{24}$ between the monopole <2> and the monopole <4> are represented by similar equations. From this, the mutual impedance $Z_{ij}$ (=$Z_{13}$+$Z_{14}$+$Z_{23}$+$Z_{24}$) between the element i and the element j is found.

On the other hand, the frequency spectrum calculation program 101 performs the processing for reading the carrier frequency (oscillating frequency) fc and the modulation frequency fm as the angle modulation information of the angle-modulated clock source from the electronic apparatus data file 2, calculating the frequency spectrum of the clock source by using the read angle modulation information, and storing the spectrum in the working memory 103.

The oscillation signal v(t) from the angle-modulated clock source is represented as:

$$v(t)=A \times \exp[j\omega_c t] \times \exp[jm_f \sin(\omega_m t)]$$

where, $\omega_c = 2\pi fc$ $\omega_m = 2\pi fm$, $m_f = \Delta\omega/\omega_m$ (modulation index)

Here, when a first type n-th order Bessel function $J_n(m_f)$ is used, it is represented as:

$$\exp[jm_f \sin(\omega_m t)] = \Sigma J_n(m_f) \times \exp[jn\omega_m t]$$

where, $\Sigma$ is a summation for n=− to +

Accordingly, the oscillation signal v(t) from the angle-modulated clock source is represented as:

$$v(t) = A \times \exp[(j\omega_c t)] \times \Sigma J_n(m_f) \times \exp(jn\omega_m t)$$

where, $\Sigma$ is the summation for n=− to +

From this, a real part of v(t) is represented as:

$$v(t) = A \times \Sigma J_n(m_n) \cdot \cos(\omega_c + n\omega_m)t$$

where, $\Sigma$ is the summation for n=− to +

Therefore, the frequency spectrum calculation program 101 calculates the frequency spectrum of the clock source as shown in FIG. 19 by calculating this equation and stores the spectrum in the working memory 103.

On the other hand, where matrixes such as the mutual impedance calculated by the simulation program 100 are reused by the simulation program 100, the matrix decomposition program 102 applies LU decomposition to these matrixes.

Namely, the LU decomposition is applied to the mutual impedance $Z(Z_{ij})$ as shown in FIG. 7. Here, the following equations stand for the matrix $L(l_{ij})$ and the matrix $U(u_{ij})$:

$$u_{ij} = z_{ij} - \Sigma l_{ik} u_{kj}$$

where, $\Sigma$ is the summation for k=1 to (j−1)

j=1 to n i=1 to j i≦j $l_{ij} = [Z_{ij} - \Sigma l_{ik} u_{kj}]u_{jj}$ where, $\Sigma Y$ is the summation for k=1 to (j−1)

i=1 to n j=1 to (i−1)

j<i $l_{iib} = 1$ where, i=1 to n

In this way, when the LU decomposition is applied to the mutual impedance Z, the simultaneous equations under the moment method are defined as:

$$[LU][I]=[V]$$

From this, the simultaneous equations under the moment method become equivalent to the solution of:

$$[U][I]=[X]$$

$$[L][X]=[V]$$

These equations can be solved at a high speed since the matrixes are triangularly decomposed as shown in FIG. 7.

By the matrix decomposition program 102, the LDU decomposition may also be applied to matrixes such as the mutual impedance.

Namely, as shown in FIG. 8, the LDU decomposition may also be applied to the mutual impedance $Z(z_{ij})$ as shown in FIG. 8. Here, the following equations stand for the matrix $D(d_{ij})$ and the matrix $L(l_{ij})$:

$$d_{ii} = Z_{ii} - \Sigma d_{kk} l_{ik}^2$$

where, $\Sigma$ is the summation for k=1 to (i−1)

i=1 to n $l_{ij} = [z_{ij} - \Sigma d_{kk} l_{ik} l_{jk}]/d_{jj}$ where, $\Sigma$ is the summation for k=1 to (j−1)

i=1 to n j<i $l_{ii} = 1$ where, i=1 to n

In this way, when the LDU decomposition is applied to the mutual impedance Z, the simultaneous equations under the moment method are defined as:

$$[LD^tL][I]=[V]$$

From this, the simultaneous equations under the moment method become equivalent to the solution of:

$$[D^tL][I]=[X] \quad [L][X]=[V]$$

These equations can be solved at a high speed since the matrixes are triangularly decomposed as shown in FIG. 8.

Figure 9A:
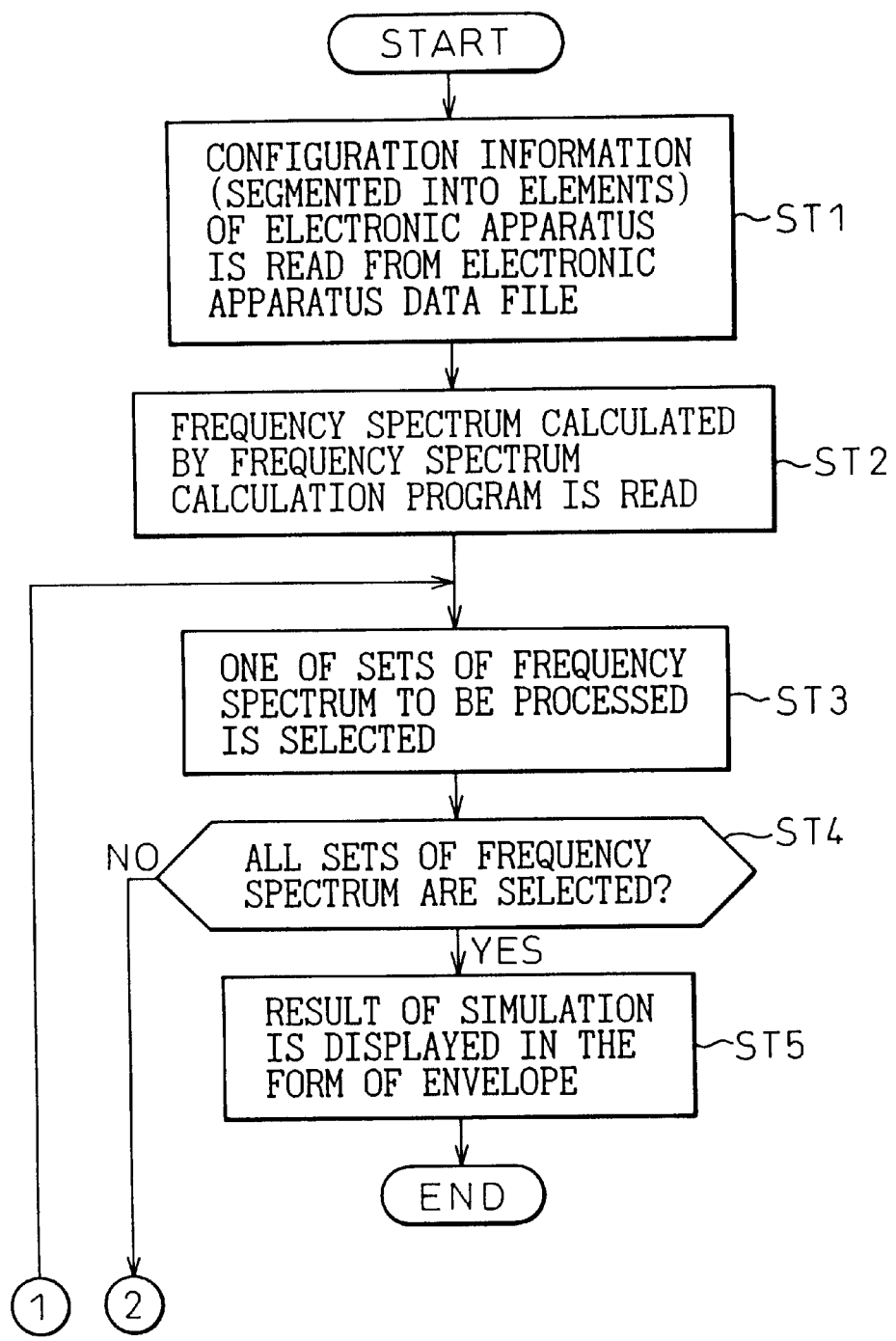
FIGS. 9A and 9B show an embodiment of a flow of processing off the simulation program.
Figure 9B:
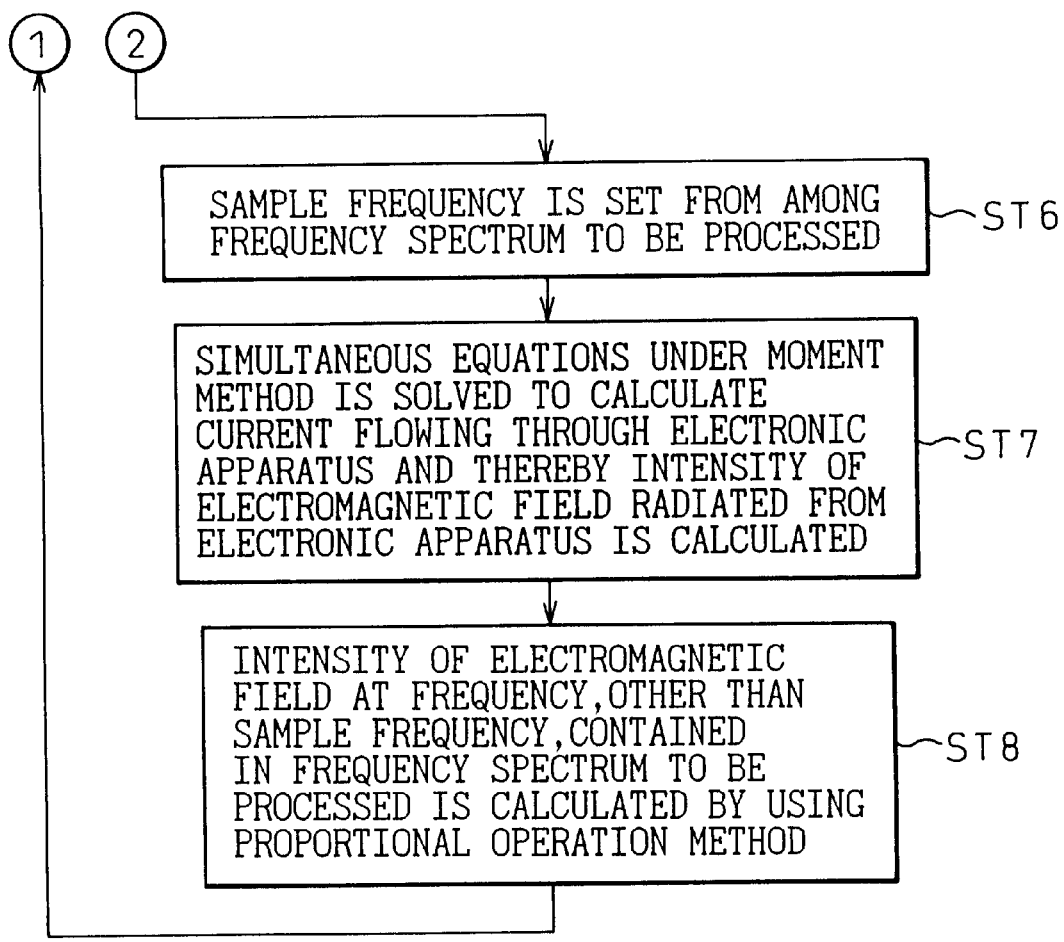

FIGS. 9A and 9B illustrate an embodiment of the flow of processing executed so as to realize the present invention by the simulation program 100. Next, the present invention will be explained in detail according to this flow of processing.

In the following explanation, for the convenience of explanation, it is assumed that the electronic apparatus to be simulated includes a plurality of clock sources (may be one) each being angle-modulated in the identical angle modulation mode (identical carrier frequency fc and modulation frequency fm are provided), and it is assumed that the frequency spectrum calculation program 101 calculates the frequency spectrum of this clock source before the execution of this flow of processing and stores the spectrum in the working memory 103.

When the simulation request of the electronic apparatus is issued, first, at step 1, the simulation program 100 reads the configuration information of the electronic apparatus segmented into elements from the electronic apparatus data file 2 as shown in the flow of processing of FIGS. 9A and 9B.

Then, at step 2, it reads the frequency spectrum calculated by the frequency spectrum calculation program 101 from the working memory 103. Namely, the frequency spectrum calculation program 101 calculates the frequency spectrum appearing in the vicinity of the carrier frequency (oscillating frequency) fc and the high harmonics (n×fc) of same as shown in FIG. 19 and stores the spectrum in the working memory 103. The frequency spectrum is read from the working memory 103.

Then, at step 3, sets of frequency spectrum to be processed are selected from among the read frequency spectrums. It is determined at the subsequent step 4 whether or not all sets of the frequency spectrum have been selected.

When it is determined by the determination processing of step 4 that not all sets of the frequency spectrum have been selected, that is when it is determined at step 3 that the frequency spectrum to be processed can be selected, it proceeds to step 6, where one or a plurality of sample frequencies are set from among sets of frequency spectrum to be processed.

Figure 10:
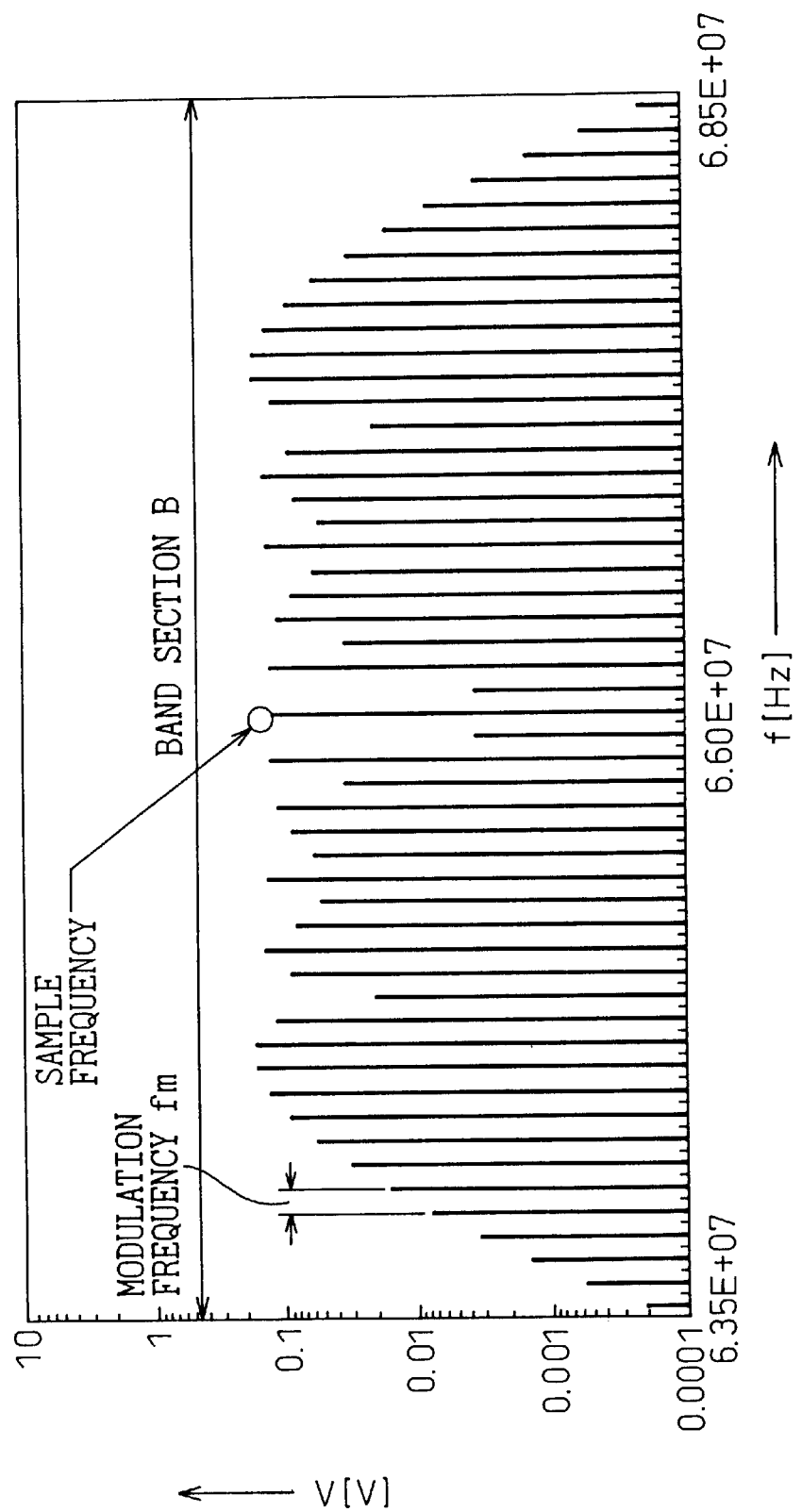
FIG. 10 is a view explaining the processing for setting the sample frequency.
Figure 11:
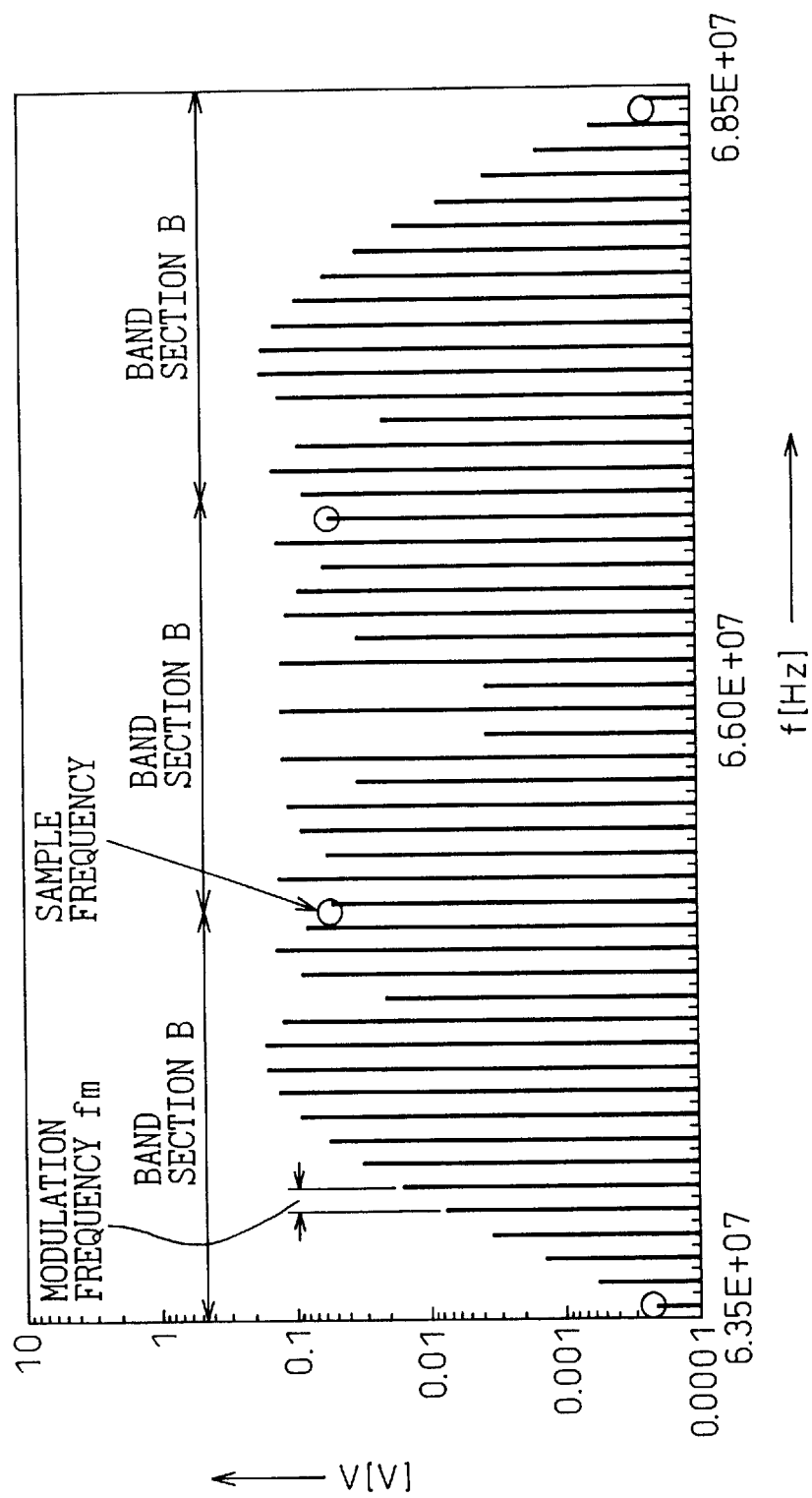
FIG. 11 is a view explaining the processing for setting the sample frequency.

In the setting processing of this sample frequency, one sample frequency will be set or a plurality of sample frequencies will be set, and when one sample frequency is set, for example, as shown in FIG. 10, the frequency located at the center (carrier frequency fc or its higher harmonics) of the sets of frequency spectrum to be processed is set as the sample frequency. Further, when a plurality of sample frequencies are set, for example, as shown in FIG. 11, the sample frequencies are set so that the sample frequencies in the upper frequency region and the sample frequencies in the lower frequency region become symmetrical.

Then, by solving the simultaneous equations under the moment method at step 7 with the sample frequency as an analyzing frequency, the electric current (electric current having the sample frequency) flowing through each element of the electronic apparatus segmented into meshes is calculated. The value of the electric current is substituted in the known theoretical electromagnetic. equations to calculate the intensity of the electromagnetic field (electromagnetic field at the frequency of the sample frequency) radiated from the electronic apparatus.

Namely, by solving the simultaneous equations under the moment method such as:

$$[Z_{ij}][I_i]=[V_i]$$

shown in FIG. 3 (simultaneous equations under the moment method shown in FIG. 4 where the dielectric is considered), the electric current flowing through each element of the electronic apparatus segmented into meshes is calculated (also the magnetic current is calculated when considering the dielectric). The value of the electric current is substituted in known theoretical electromagnetic equations so as to calculate the intensity of the electromagnetic field radiated from the electronic apparatus.

Figure 12:
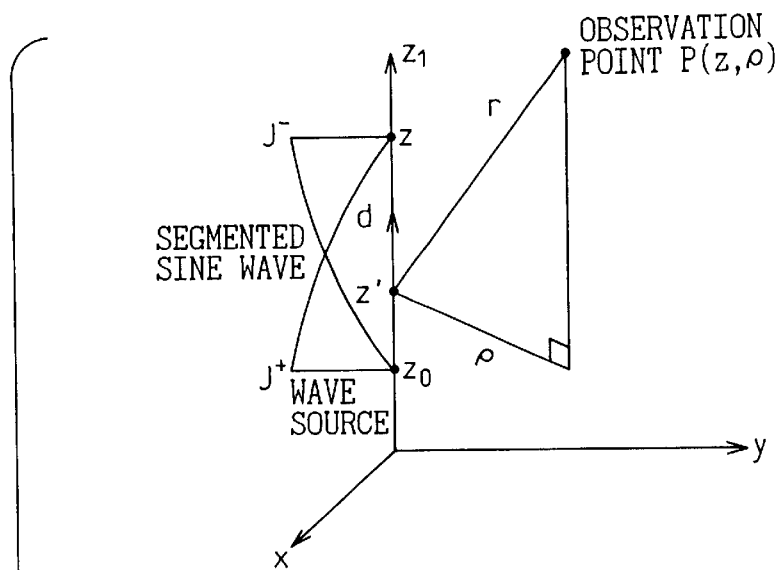
FIG. 12 is a view of the relationship between the wave source and an observation point.

The intensity of the electromagnetic field induced by the electric current is known, so details thereof will be omitted, but when assuming for example the relationship between the wave source and the observation point as shown in FIG. 12 and assuming $J^+$ shown in the figure as the distribution of the electric current of the wave source, a z-direction component $Ez^+$ and $\rho$-direction component $E\rho^+$ of the electric field induced by the electric current $J^+$ will be calculated according to the calculation equation shown in FIG. 13.

Subsequently, at step 8, by the calculation for the intensity of the electromagnetic field at a frequency other than the sample frequency contained in the frequency spectrum to be processed by using the technique of proportional operation, the calculation is carried out without use of the moment method.

In the present invention, note was taken of the fact that the mutual impedance $[Z_{ij}]$ (also mutual admittance $[Y_{ij}]$ and mutual reaction $[B_{ij}]$ when considering the dielectric) exhibits a smooth characteristic along with the frequency and thus, in a small band (fa to fb) of the frequency, there is no problem in practical use even if it approximates to:

$$[Z_{ij}(fa)] \approx [Z_{ij}(fb)]$$

so the relationship between $[I_i(fa)]$ and $[I_i(fb)]$ is in substantially proportional to the relationship between $[V_i(fa)]$ and $[V_i(fb)]$, and thereby the intensity of the electromagnetic field at a frequency other than the sample frequency contained in the frequency spectrum to be processed is calculated by using not the moment method, but the proportional operation method.

Figure 14A:
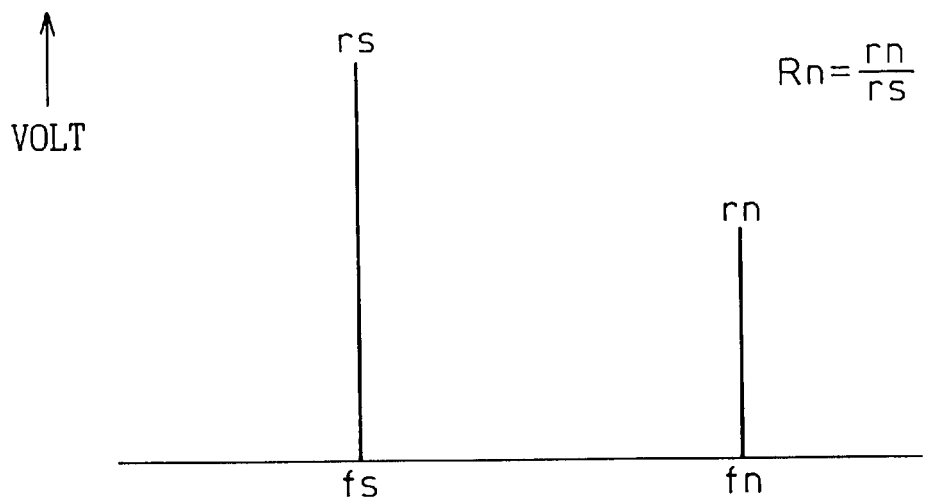
FIGS. 14A and 14B are views explaining the processing for execution of the simulation program.
Figure 14B:
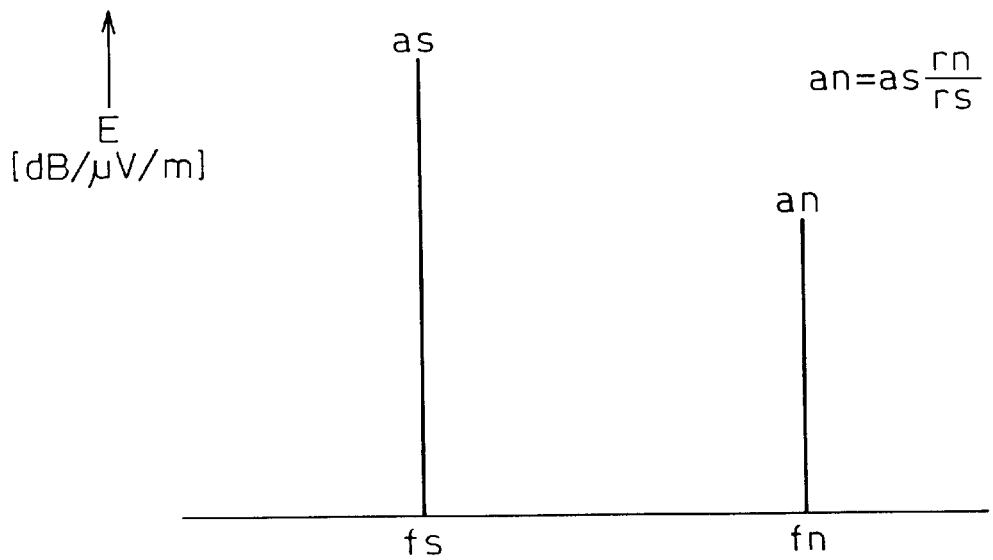

Namely, taking note of the fact that, when setting one sample frequency, there is no problem in practical use even if approximating by $[Z_{ij}(fa)] \approx [Z_{ij}(fb)]$ in the small band (fa to fb) of the frequency spectrum to be processed, as shown in FIG. 14A, the ratio Rn (=rn/rs) between the intensity rs of the frequency spectrum at the sample frequency fs and the intensity rn of the frequency spectrum at a frequency fn other than fs is found and, as shown in FIG. 14B, the product of this ratio (Rn) and the intensity (as) of the electromagnetic field at the sample frequency fs is found at step 7 so as to calculate the intensity an of the electromagnetic field at a frequency fn other than the sample frequency contained in the frequency spectrum to be processed without use of the moment method.

Figure 15A:
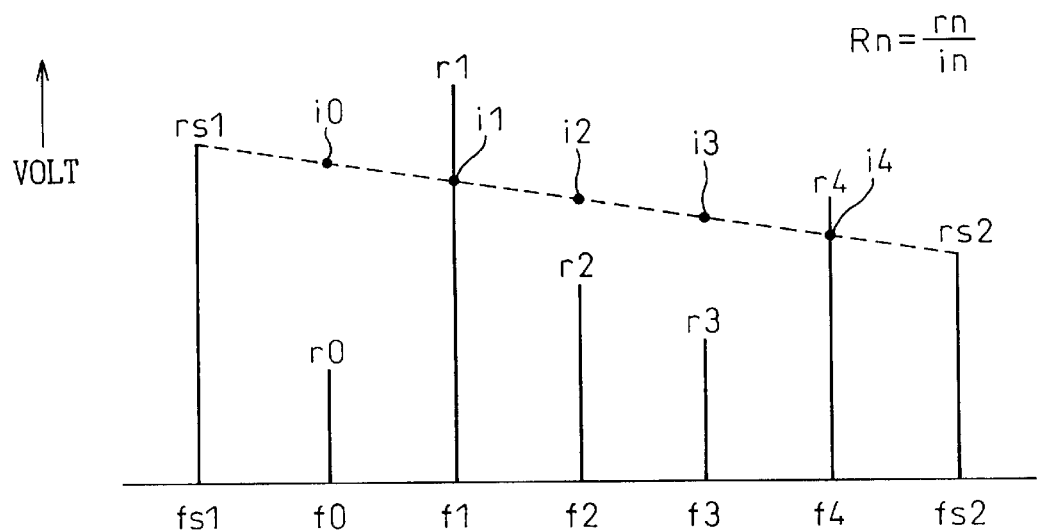
FIGS. 15A and 15B are views explaining the processing for execution of the simulation program.

Further, when a plurality of sample frequencies are set so as to improve the precision over the case where one sample frequency is set, taking note of the fact that there is no problem in practical use even if approximating by $[Z_{ij}(fa)] \approx [Z_{ij}(fb)]$ in the small band (fa to fb) at the frequency split off from the frequency spectrum to be processed, as shown in FIG. 15A, linear interpolation is applied to the frequency spectrum intensity rs1 at the sample frequency fs1 and the frequency spectrum intensity rs2 at the sample frequency fs2 located at the two ends so as to find a linearly interpolated value (in) at the frequency fn (n=0, 1, 2, 3, 4) sandwiched between the two sample frequencies (fs1, fs2) and find the ratio Rn (=rn/in) between the linearly interpolated value (in) and the frequency spectrum intensity (rn) at the frequency fn.

Figure 15B:
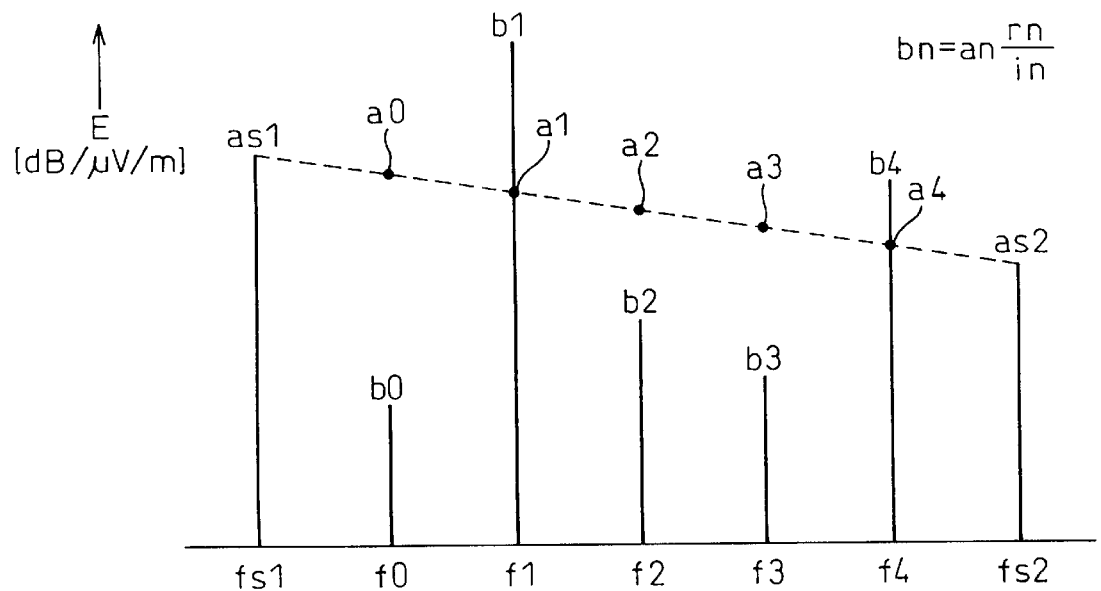

Then, as shown in FIG. 15B, by applying linear interpolation between the electromagnetic field intensity as1 at the sample frequency fs1 found at step 7 and the electromagnetic field intensity as2 at the sample frequency fs2 found at step 7, a linearly interpolated value (an) at the frequency fn sandwiched between the two sample frequencies (fs1, fs2) is found. By finding the product of this linearly interpolated value (an) and the ratio (Rn), the electromagnetic field intensity (bn) at a frequency fn other than the sample frequency contained in the frequency spectrum to be processed is calculated without use of the moment method.

By using the technique of this proportional operation, it becomes possible to calculate, at an extremely high speed the intensity of the electromagnetic field at a frequency other than the sample frequency contained in the frequency spectrum to be processed without use of the moment method.

Note that, in the apparatus 1*a* for calculating the intensity of the radiated electromagnetic field according to the present invention, processing is carried out for calculating the intensity of the electromagnetic field radiated from the electronic apparatus. Accordingly, at step 7, a configuration is employed in which the electric current flowing through the electronic apparatus is simulated by solving the moment method, then the intensity of the electromagnetic field induced by the electric current is calculated.

Therefore, at step 8, a configuration is employed where the intensity of the electromagnetic field at a frequency other than the sample frequency contained in the frequency spectrum to be processed is found by applying a proportional operation to the intensity of the electromagnetic field calculated at step 7, but when there is a request to simulate the electric current flowing through the electronic apparatus, the configuration is employed of finding the electric current at a frequency other than the sample frequency contained in the frequency spectrum to be processed by applying proportional operation to the electric current calculated at step 7.

In this way, the frequency spectrum to be processed is selected at step 3, then the simultaneous equations are solved under the moment method at step 7 so as to calculate the contained of the electromagnetic field at the sample frequency contained in the frequency spectrum to be processed, the technique of proportional operation is used to calculate the intensity of the electromagnetic field at a frequency other than the sample frequency contained in the frequency spectrum to be processed so as to calculate the intensity of the electromagnetic field at the frequency contained in the frequency spectrum to be processed at step 8, then step 3 is returned to so as to select the next frequency spectrum to be processed. This processing is repeated.

Then, when it is determined at step 4 that the selection of all frequency spectrums calculated by the frequency spectrum calculation program 101 has been finished, the routine proceeds to step 5 where the envelope of the intensity of the electromagnetic field in the frequency domain found at discrete frequencies is found as shown in FIG. 16. This is displayed on the display unit 3a, and the processing is finished. Here, the envelope may also be found by adopting linear interpolation so as to simplify the processing.

In this way, when calculating the intensity of the electromagnetic field radiated from an electronic apparatus having an angle-modulated wave source, the apparatus 1a for calculating the intensity of a radiated electromagnetic field according to the present invention performs correct simulation processing to calculate the intensity of the electromagnetic field for only the sample frequency and uses the results of the calculation to calculate the intensity of the electromagnetic field according to a proportional operation for frequencies other than the sample frequency, therefore it becomes possible to calculate the intensity of the electromagnetic field radiated from an electronic apparatus having an angle-modulated wave source in a time practical.

In explaining the flow of processing of FIGS. 9A and 9B, for convenience of explanation, it was assumed that the electronic apparatus to be simulated had a plurality of clock sources (may be one) each angle-modulated in the identical angle modulation mode, but when for the apparatus has both of for example an angle-modulated wave source and a non-angle-modulated wave source and, at the same time, the frequencies of these wave sources overlap or when the apparatus has a plurality of wave sources angle-modulated in different angle modulation modes and, at the same time, the frequencies of these wave sources overlap, it is necessary to use the "superimposition" principle of performing the simulation processing assuming that there is only one wave source at a time and superimposing the results of the simulation in order to calculate the intensity of the electromagnetic field radiated from the electronic apparatus.

The reason why the above proportional operation can be used is that all clock sources are angle-modulated in the identical angle modulation mode. If such a condition does not stand, it is necessary to use the principle of superimposition.

When the principle of superimposition is used, the mutual impedance $Z_{ij}$ (also mutual admittance $[Y_{ij}]$ and the mutual reaction $[B_{ij}]$ when considering the dielectric) found in the processing at step 7 in the flow of processing of FIGS. 9A and 9B is reused.

For example, when a wave source angle-modulated in the angle modulation mode having the carrier frequency (oscillating frequency) fc and the modulation frequency fm and a non-angle-modulated wave source having the oscillating frequency fc are mixed, if the carrier frequency fc is set as the sample frequency for the former wave source, the mutual impedance $[Z_{ij}(fc)]$ will be found. Then, this mutual impedance $[Z_{ij}(fc)]$ can be reused when applying the moment method with respect to the latter wave source.

Figure 17B:
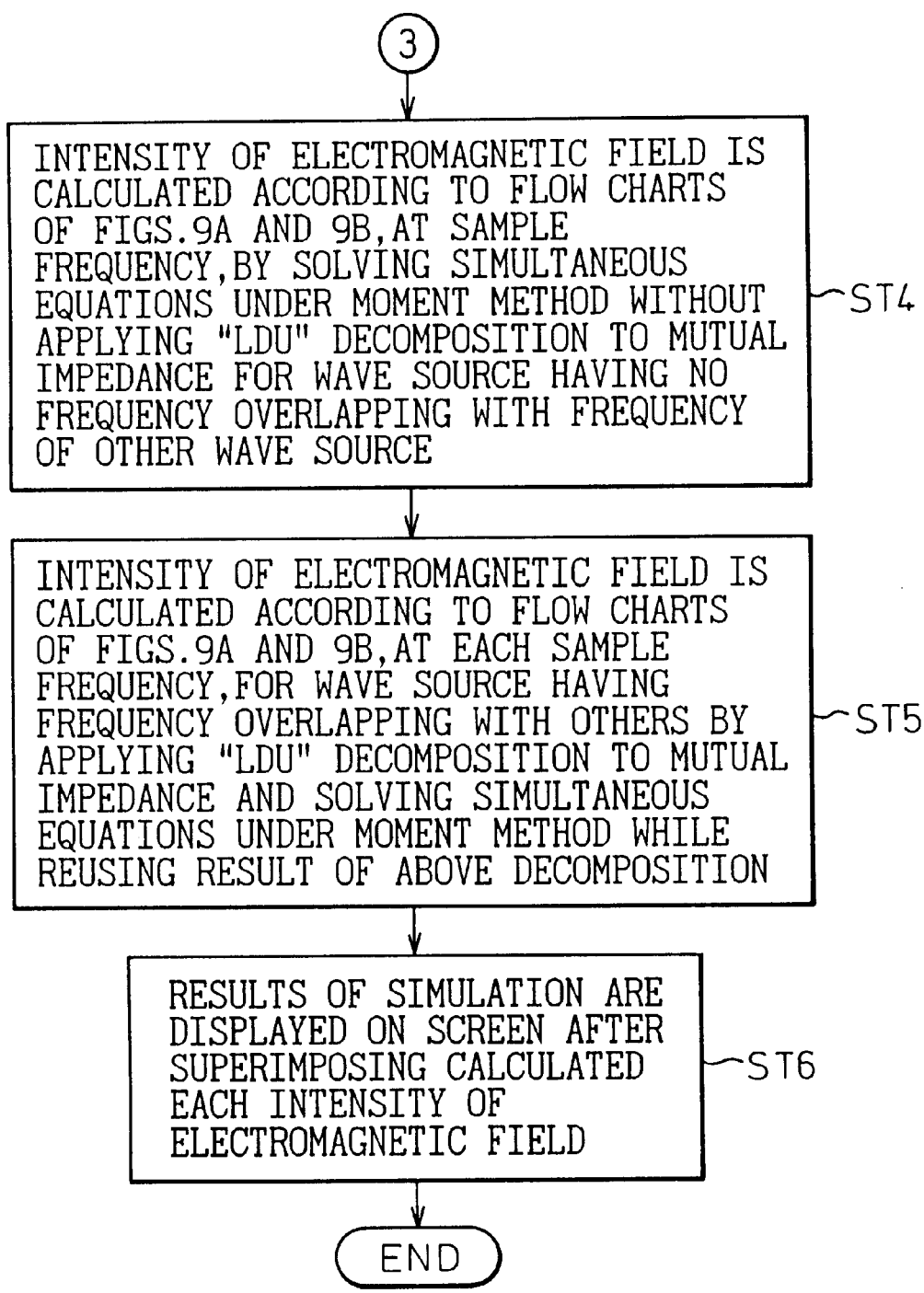
Figure 18A:
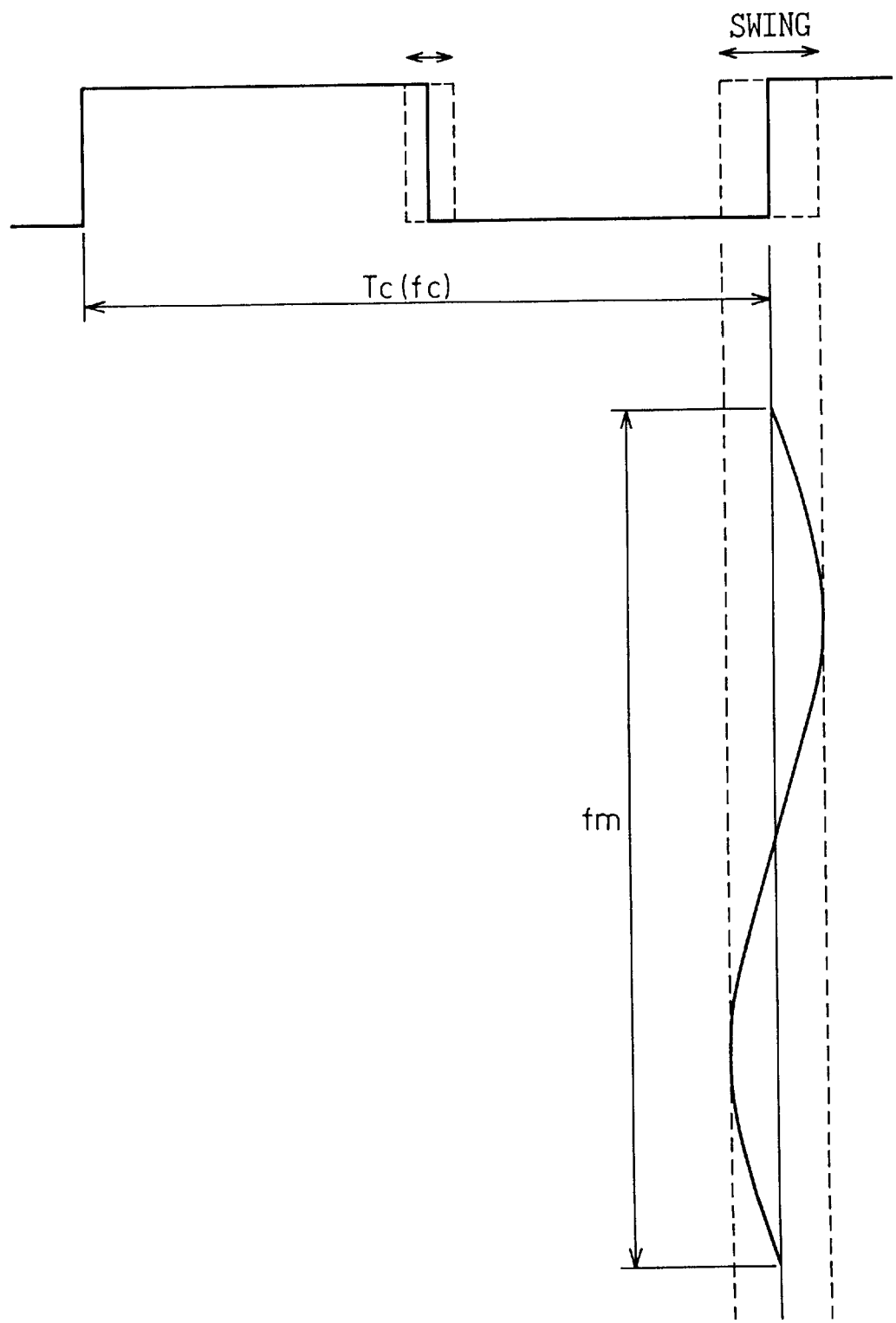

Therefore, at first, as shown in the flow of processing of FIGS. 17A and 17B, the simulation program 100 reads the configuration information segmented into elements of the electronic apparatus from the electronic apparatus data file 2 at step 1. At the subsequent step 2, the frequency spectrum calculated by the frequency spectrum calculation program 101 is read from the working memory 103. At the subsequent step 3, the wave sources are grouped by forming into one group a plurality of wave sources angle-modulated in the identical angle modulation mode and forming into one group a plurality of wave sources having the identical oscillating frequency.

Subsequently, at step 4, the intensity of the electromagnetic field radiated from the electronic apparatus is calculated for the group of wave sources with frequencies which do not overlap according to the flow of processing of FIGS. 9A and 9B while solving the moment method without applying LU decomposition (LDU decomposition) to the mutual impedance $Z_{ij}$ etc.

Subsequently, at step 5, by starting the matrix decomposition program 102 when first calculating the mutual impedance $Z_{ij}$ etc. for the group of wave sources with frequencies which overlap, LU decomposition (LDU decomposition) is applied to the mutual impedance $Z_{ij}$ etc. Thereafter, when the mutual impedance $Z_{ij}$ etc. are used, use is made of $Z_{ij}$ to which the LU decomposition (LDU decomposition) is applied by the matrix decomposition program 102 so as to calculate the intensity of the electromagnetic field radiated from the electronic apparatus according to the flow of processing of FIGS. 9A and 9B while solving the moment method.

Then, finally, at step 6, the intensities of the electromagnetic fields calculated in this way are superimposed, the results of simulation are displayed, and the processing is finished.

In this way, when adopting a configuration of performing simulation processing according to the flow of processing of FIGS. 9A and 9B, if an angle-modulated wave source and non-angle-modulated wave source are mixed or if wave sources angle-modulated in different angle modulation modes are mixed and the frequencies of the wave sources overlap, the simulation program 100 applies LU decomposition (LDU decomposition) to the mutual impedance $Z_{ij}$ etc. so as to solve the moment method at a high speed and thereby calculates the intensity of the electromagnetic field radiated from the electronic apparatus at a high speed.

The present invention was explained according to an illustrated embodiment, but the present invention is not limited to this. For example, the embodiment assumed an angle-modulated wave source in the pulse frequency modulation mode, but the present invention can be applied as it is also to an angle-modulated wave source in the pulse width modulation mode (modulation system not swinging in frequency, but swinging in pulse width).

Further, the embodiment assumed a simulation technique using the moment method, but the present invention can be applied as it is also to the case where another simulation technique such as the finite element method is used.

Summarizing the effects of the invention, as explained above, in the simulation apparatus of the present invention, taking note of the fact that, when adopting a configuration of simulating the electric current flowing through each element of the electronic apparatus or the intensity of the electromagnetic field radiated from the electronic apparatus according to the moment method or other analysis in the frequency domain for an electronic apparatus having an angle-modulated wave source, a proportional relationship stands among physical amounts to be calculated due to the fact that, in a frequency domain narrow to a certain extent, there is almost no change of the matrix (mutual impedance etc. in the case of the moment method) used in the analysis in the frequency domain, and thus simulation results are obtained at only the sample frequency by carrying out accurate simulation processing, while for the frequencies other that frequency, the former simulation results are used to obtain the latter simulation results according to a proportional operation, whereby it becomes possible to execute the simulation processing at an extremely high speed.

By this, it becomes possible to simulate the electric current flowing through an electronic apparatus having an angle-modulated wave source or the intensity of the electromagnetic field radiated from the electronic apparatus having the angle-modulated wave source within a practical time.

Further, in the simulation apparatus of the present invention, the discrete simulation results in the frequency domain acquired by this simulation processing are not output as they are, but are output in the form of an envelope which form is identical to that acquired in the actual measurement unit (for example, spectrum analyzer). By this, it becomes possible to show the simulation results to the user without causing discomfort.

While the invention has been described with reference to specific embodiments chosen for purposes of illustration, it should be apparent that numerous modifications could be made thereto by those skilled in the art without departing from the basic concept and scope of the invention.

What is claimed is:

1. An apparatus for simulation of an electric current flowing through each element of an electronic apparatus having an angle-modulated wave source or the intensity of the electromagnetic field radiated from the electronic apparatus according to analysis in the frequency domain, comprising:
   a setting unit to select a frequency spectrum to be processed from among frequency spectrums included in said wave source and setting one sample frequency from the selected spectrum;
   a calculating unit to calculate a first physical amount to be calculated at the analyzing frequency by analysis in the frequency domain with said sample frequency as the analyzing frequency; and
   a computing unit to calculate a second physical amount to be calculated by finding a ratio between a wave source value at said sample frequency and a wave source value at a frequency other than the sample frequency and process the ratio and the first physical amount calculated by the calculating unit.

2. An apparatus for simulation as set forth in claim 1, wherein the setting unit sets a center frequency of the frequency spectrum to be processed as the sample frequency.

3. An apparatus for simulation as set forth in claim 1, wherein the calculating unit uses a moment method as the analysis in the frequency domain.

4. An apparatus for simulation as set forth in claim 1, further comprising:
   a detecting unit to detect whether or not a matrix used in the analysis in the frequency domain will be reused by the calculating unit when the electronic apparatus has a plurality of wave sources; and
   a decomposition unit to apply LU decomposition or LDU decomposition to the matrix which is reusable and is detected by said detecting unit.

5. An apparatus for simulation as set forth in claim 1, further comprising:
   a specifying unit to specify an envelope of discrete physical amounts calculated by said calculating unit; and
   an output unit to output the envelope specified by said specifying unit to an output apparatus.

6. An apparatus for simulation of an electric current flowing through each element of an electronic apparatus having an angle-modulated wave source or an intensity of an electromagnetic field radiated from the electronic apparatus according to analysis in the frequency domain, comprising:
   a setting unit to select a frequency spectrum to be processed from among frequency spectrums included in said wave source and setting a plurality of sample frequencies from the selected spectrum;
   a calculating unit to calculate first physical amounts to be calculated at the analyzing frequency by analysis in the frequency domain with each sample frequency as the analyzing frequency for every said sample frequency; and
   a computing unit to find a ratio between a wave source value at a frequency sandwiched between adjoining sample frequencies and a corresponding linear interpolation value derived by linear interpolation on the wave source values at the sample frequencies and process the ratio and the corresponding linear interpolation value derived by linear interpolation of the first physical amounts calculated by the calculating unit so as to calculate the second physical amount to be calculated.

7. An apparatus for simulation as set forth in claim 6, wherein the setting unit sets sample frequencies so that the sample frequency in an upper frequency region and the sample frequency in a lower frequency region become symmetrical about the center frequency of the frequency spectrum to be processed.

8. An apparatus for simulation as set forth in claim 6, wherein the calculating unit uses a moment method as the analysis in the frequency domain.

9. An apparatus for simulation as set forth in claim 6, further comprising:
   a detecting unit to detect whether or not a matrix used in the analysis in the frequency domain will be reused by the calculating unit when the electronic apparatus has a plurality of wave sources; and
   a decomposition unit to apply LU decomposition or LDU decomposition to the matrix which is reusable and is detected by said detecting unit.

10. An apparatus for simulation as set forth in claim 6, further comprising:
    a specifying unit to specify an envelope of discrete physical amounts calculated by said calculating unit; and an output unit to output the envelope specified by said specifying unit to an output apparatus.

11. A method for simulation of an electric current flowing through each element of an electronic apparatus having an angle-modulated wave source or an intensity of an electromagnetic field radiated from the electronic apparatus according to analysis in the frequency domain comprising:

selecting a frequency spectrum to be processed from among frequency spectrums included in said wave source and setting one sample frequency from the selected spectrum;

calculating a first physical amount to be calculated at an analyzing frequency by analysis in the frequency domain for said sample frequency as the analyzing frequency; and calculating a second physical amount to be calculated by finding a ratio between a wave source value at said sample frequency and a wave source value at a frequency other than the sample frequency and processing the ratio and the first physical amount calculated by the calculating the first physical amount.

12. A method for simulation as set forth in claim 11, further comprising:

specifying an envelope of discrete physical amounts calculated at the calculating a first physical amount and calculating a second physical amount respectively; and outputting the envelope specified at the specifying to an output apparatus.

13. A storage medium storing programs used for realization of a simulation apparatus calculating an electric current flowing through each element of an electronic apparatus having an angle-modulated wave source or an intensity of an electromagnetic field radiated from the electronic apparatus according to analysis in the frequency domain, programs controlling a computer to perform a method comprising:

selecting a frequency spectrum to be processed from among frequency spectrums included in said wave source and setting one sample frequency from the selected spectrum;

calculating a first physical amount to be calculated at an analyzing frequency by analysis in the frequency domain for said sample frequency as the analyzing frequency; and calculating a second physical amount to be calculated by finding a ratio between a wave source value at said sample frequency and a wave source value at a frequency other than the sample frequency and processing the ratio and the first physical amount calculated by the calculating the first physical amount.

14. A storage medium as set forth in claim 13, said method further comprising:

specifying processing to specify an envelope of discrete physical amounts calculated respectively by said calculating processing and said computer processing; and outputting processing to output the envelope specified by said specifying processing to an output apparatus.

15. A method for simulation of an electric current flowing through each element of an electronic apparatus having an angle-modulated wave source or an intensity of an electromagnetic field radiated from the electronic apparatus according to analysis in the frequency domain, comprising:

selecting a frequency spectrum to be processed from among frequency spectrums included in said wave source and setting sample frequencies from the selected spectrum;

calculating first physical amounts to be calculated at an analyzing frequency by analysis in the frequency domain for said sample frequency as the analyzing frequency; and finding a ratio between a wave source value at a frequency sandwiched between adjoining sample frequencies and a corresponding linear interpolation value derived by linear interpolation on the wave source values at the sample frequencies and processing the ratio and the corresponding linear interpolation value derived by linear interpolation of the first physical amounts calculated by the calculating first physical amounts to be calculated so as to calculate the second physical amount to be calculated.

16. A method for simulation as set forth in claim 15, further comprising:

specifying an envelope of discrete physical amounts calculated at the calculating and the finding respectively; and outputting the envelope specified at the specifying to an output apparatus.

17. A storage medium storing programs used to realize a simulation apparatus to calculate an electric current flowing through each element of an electronic apparatus having an angle-modulated wave source or an intensity of an electromagnetic field radiated from the electronic apparatus according to analysis in the frequency domain, said programs controlling a computer to perform a method comprising:

setting processing to select a frequency spectrum to be processed from among frequency spectrums included in said wave source and setting a plurality of sample frequencies from the selected spectrum;

calculating processing to calculate first physical amounts to be calculated at an analyzing frequency by analysis in the frequency domain for said sample frequencies as the analyzing frequency; and computing processing to find a ratio between a wave source value at a frequency sandwiched between adjoining sample frequencies and a corresponding linear interpolation value derived by linear interpolation on the wave source values at the sample frequencies and process the ratio and the corresponding linear interpolation value derived by linear interpolation of the first physical amounts calculated by the calculating processing so as to calculate the second physical amount to be calculated.

18. A storage medium as set forth in claim 17, said method further comprising:

specifying processing to specify an envelope of discrete physical amounts calculated respectively by said calculating processing and said computing processing; and outputting processing to output the envelope specified by said specifying processing to an output apparatus.

19. An apparatus for simulation of an electric current flowing through each element of an electronic apparatus having an angle-modulated wave source or the intensity of the electromagnetic field radiated from the electronic apparatus according to analysis in the frequency domain, comprising:

a setting unit to select a frequency spectrum to be processed from among frequency spectrums included in said wave source and setting one sample frequency from the selected spectrum;

a calculating unit to calculate a first physical amount to be calculated at the analyzing frequency by analysis in the frequency domain with said sample frequency as the analyzing frequency;

a computing unit to calculate a second physical amount to be calculated in the frequency domain of said frequency spectrum to be processed from the first physical amount, a wave source value of said sample frequency, and a wave source value of said frequency spectrum to be processed except said sample frequency;

a detecting unit to detect whether or not a matrix used in the analysis in the frequency domain will be reused by the calculating unit when the electronic apparatus has a plurality of wave sources; and a decomposition unit to apply LU decomposition or LDU decomposition to the matrix which is reusable and is detected by said detecting unit.

20. An apparatus for simulation of an electric current flowing through each element of an electronic apparatus having an angle-modulated wave source or an intensity of an electromagnetic field radiated from the electronic apparatus according to analysis in the frequency domain, comprising:

a setting unit to select a frequency spectrum to be processed from among frequency spectrums included in said wave source and setting a plurality of sample frequencies from the selected spectrum;

a calculating unit to calculate a first physical amount to be calculated at the analyzing frequency by analysis in the frequency domain with each sample frequency as the analyzing frequency for every said sample frequency;

a computing unit to calculate a second physical amount to be calculated in the frequency domain of said frequency spectrum to be processed from the first physical amount, a wave source value of said sample frequency, and a wave source value of said frequency spectrum to be processed sandwiched by said sample frequencies;

a detecting unit to detect whether or not a matrix used in the analysis in the frequency domain will be reused by the calculating unit when the electronic apparatus has a plurality of wave sources; and a decomposition unit to apply LU decomposition or LDU decomposition to the matrix which is reusable and is detected by said detecting unit.

\* \* \* \* \*